(12) United States Patent
Horikiri

(10) Patent No.: US 11,380,765 B2
(45) Date of Patent: Jul. 5, 2022

(54) STRUCTURE AND INTERMEDIATE STRUCTURE

(71) Applicants: SCIOCS COMPANY LIMITED, Ibaraki (JP); SUMITOMO CHEMICAL COMPANY, LIMITED, Tokyo (JP)

(72) Inventor: Fumimasa Horikiri, Ibaraki (JP)

(73) Assignees: SCIOCS COMPANY LIMITED, Ibaraki (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/288,376

(22) Filed: Feb. 28, 2019

(65) Prior Publication Data

US 2019/0273139 A1 Sep. 5, 2019

(30) Foreign Application Priority Data

Mar. 2, 2018 (JP) .............................. JP2018-037473
Jul. 13, 2018 (JP) .............................. JP2018-133632

(51) Int. Cl.
*H01L 29/15* (2006.01)
*H01L 31/0256* (2006.01)
*H01L 29/20* (2006.01)
*H01L 29/06* (2006.01)
*H01L 21/02* (2006.01)
(Continued)

(52) U.S. Cl.
CPC ...... *H01L 29/2003* (2013.01); *H01L 21/0254* (2013.01); *H01L 21/0262* (2013.01); *H01L 21/02458* (2013.01); *H01L 21/02491* (2013.01); *H01L 21/02658* (2013.01); *H01L 21/302* (2013.01); *H01L 29/0634* (2013.01); *H01L 29/0657* (2013.01); *H01L 33/0025* (2013.01); *H01L 29/0619* (2013.01); *H01L 29/7827* (2013.01); *H01L 29/8613* (2013.01); *H01L 29/872* (2013.01)

(58) Field of Classification Search
None
See application file for complete search history.

(56) References Cited

U.S. PATENT DOCUMENTS

2007/0138546 A1* 6/2007 Kawamura ......... H01L 29/0653
257/330
2011/0237077 A1* 9/2011 Kawashima ...... H01L 21/02513
438/689

(Continued)

FOREIGN PATENT DOCUMENTS

| JP | 2009-032873 A | 2/2009 |
|---|---|---|
| JP | 2013026609 A | 2/2013 |
| JP | 2017-077978 A | 4/2017 |

OTHER PUBLICATIONS

Murata, Junji, et al., "Photo-electrochemical etching of free-standing GaN wafer surfaces grown by hydride vapor phase epitaxy", Electrochimica Acta 171, 2015, pp. 89-95.

(Continued)

*Primary Examiner* — Calvin Y Choi
(74) *Attorney, Agent, or Firm* — Pearne & Gordon LLP

(57) ABSTRACT

This invention provides a novel structure formed from GaN material using PEC etching. The structure comprises a member constituted by a single crystal of gallium nitride and the member includes a recess having an aspect ratio of 5 or more.

7 Claims, 18 Drawing Sheets

(51) Int. Cl.
*H01L 21/302* (2006.01)
*H01L 33/00* (2010.01)
*H01L 29/861* (2006.01)
*H01L 29/872* (2006.01)
*H01L 29/78* (2006.01)

(56) References Cited

U.S. PATENT DOCUMENTS

| | | | |
|---|---|---|---|
| 2014/0339566 A1* | 11/2014 | Seo | H01L 33/42 |
| | | | 257/76 |
| 2015/0014700 A1* | 1/2015 | Khalil | H01L 29/7788 |
| | | | 257/76 |
| 2015/0087158 A1* | 3/2015 | Sugita | C23C 16/4408 |
| | | | 438/761 |
| 2015/0096488 A1* | 4/2015 | Lu | C30B 25/186 |
| | | | 117/94 |
| 2018/0337042 A1* | 11/2018 | Chu | H01L 21/02639 |

OTHER PUBLICATIONS

Samukawa, Seiji, "Ultimate Top-down Etching Processes for Future Nanoscale Devices: Advanced Neutral-Beam Etching", Japanese Journal of Applied Physics, vol. 45, No. 4A, 2006, pp. 2395-2407.
Faraz, T., et al. "Atomic Layer Etching: What Can We Learn from Atomic Layer Deposition?", ECS Journal of Solid State Science and Technology, Department of Applied Physics, Eindhoven University of Technology, 5600 MB Eindhoven, The Netherlands, 4 (6) N5023-N5032, 2015.

* cited by examiner $V_{etch}$=3V, 4μm-etch $V_{etch}$=2V, 4μm-etch $V_{etch}$=1V, 4μm-etch

STRUCTURE AND INTERMEDIATE STRUCTURE

TECHNICAL FIELD

The present invention relates to a structure and an intermediate structure.

DESCRIPTION OF RELATED ART

Gallium nitride (GaN) is used as a material for producing semiconductor devices such as light-emitting elements and transistors, and is also attracting attention as a material for micro-electro-mechanical systems (MEMS).

Etching that involves anodic oxidation (also referred to as "photo-electrochemical (PEC) etching" below) is being proposed as a technique to etch GaN materials (see, for example, J. Murata et al., "Photo-electrochemical etching of free-standing GaN wafer surfaces grown by hydride vapor phase epitaxy", Electrochimica Acta 171 (2015) 89-95). PEC etching is preferable because it is a type of wet etching that causes less damage compared to ordinary dry etching and also because the device used in the etching is more simple compared to special dry etching techniques that are designed to cause less damage, such as neutral-beam etching (see, for example, S. Samukawa, JJAP, 45(2006)2395) and atomic layer etching (see, for example, T. Faraz, ECS J. Solid Stat. Scie. & Technol., 4, N5023 (2015)).

Much is still unknown, however, about what ways GaN materials can be processed using PEC etching.

One objective of the present invention is to provide a novel structure formed from GaN material using PEC etching.

SUMMARY OF THE INVENTION

An aspect of the present invention provides
a structure comprising a member constituted by a single crystal of gallium nitride,
the member including a recess, the recess having an aspect ratio of 5 or more.

Another aspect of the present invention provides
a structure comprising a member constituted by a single crystal of gallium nitride,
the member including a protrusion, the protrusion having an aspect ratio of 5 or more.

Another aspect of the present invention provides
a structure comprising a member constituted by a single crystal of gallium nitride,
the member including a recess or a protrusion,
a side face of the recess or a side face of the protrusion being a face smoother than a side face formed by etching the member with hot phosphoric acid sulfuric acid.

Another aspect of the present invention provides
a structure comprising a member constituted by a single crystal of gallium nitride,
the member including a recess or a protrusion, wherein
in a scanning electron microscopy cathodoluminescence image of the recess, compared to a dark spot resulting from a dislocation and observed in a bottom face of the recess, an area on the outside of the dislocation in the bottom face is observed as being lighter, and a side face of the recess is observed as being lighter than the dark spot, or
in a scanning electron microscopy cathodoluminescence image of the protrusion, compared to a dark spot resulting from a dislocation and observed in the bottom face on the outside of the protrusion, an area on the outside of the dislocation in the bottom face is observed as being lighter, and a side face of the protrusion is observed as being lighter than the dark spot.

Another aspect of the present invention provides
a structure comprising a member constituted by a single crystal of gallium nitride,
the member including a recess or a protrusion, wherein
each of band-edge peak intensities of PL emission spectra for a side face of the recess and a bottom face of the recess has an intensity that is 90% or more in relation to a band-edge peak intensity of a PL emission spectrum for an upper face on the outside of the recess, or
each of band-edge peak intensities of PL emission spectra for a side face of the protrusion and a bottom face on the outside of the protrusion has an intensity that is 90% or more in relation to a band-edge peak intensity of a PL emission spectrum for an upper face of the protrusion.

Another aspect of the present invention provides
an intermediate structure comprising
a member constituted by a single crystal of gallium nitride, and
a mask formed upon the member, wherein
the member is etched to a depth of 5 μm or more using the mask,
side etching occurs in the form of recession of the member directly under the mask, and
a side etching width directly under the mask is 1 μm or less.

There is provided a novel structure formed from GaN material using PEC etching.

DETAILED DESCRIPTION OF THE INVENTION

A gallium nitride (GaN) material 100 according to an embodiment of the present invention will be described. Also will be described etching that involves anodic oxidation (also referred to as "photo-electrochemical (PEC) etching" below) and that is to be performed on the GaN material 100. PEC etching can be used as a method for processing the GaN material 100 and also as a method for evaluating a characteristic of the GaN material 100.

First Embodiment

Figure 1A:
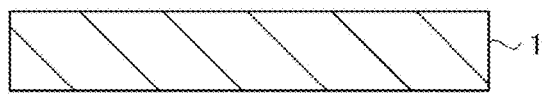
FIGS. 1A through 1G are schematic sectional diagrams illustrating a method for producing a GaN material (substrate) according to a first embodiment of the present invention.

A first embodiment will be described first. The first embodiment illustrates a GaN substrate 10 (also referred to as "substrate 10" below) as an example of the GaN material 100. FIGS. 1A through 1G are schematic sectional diagrams illustrating the process of producing the substrate 10 using a void-assisted separation (VAS) method. First, an underlying substrate 1 is prepared, as illustrated in FIG. 1A. A sapphire substrate is illustrated as an example of the underlying substrate 1.

Figure 1B:

Next, an underlying layer 2 is formed on the underlying substrate 1, as illustrated in FIG. 1B. The underlying layer 2 may be constituted by, for example, a stack including a buffer layer constituted by low temperature-grown GaN and a single crystal layer of GaN. The buffer layer and the single crystal layer may be formed by, for example, metalorganic vapor phase epitaxy (MOVPE). Trimethyl gallium (TMG) may be used as an example of gallium (Ga) raw material and ammonia ($NH_3$) may be used as an example of nitrogen (N) raw material. The thicknesses of the buffer layer and the single crystal layer may respectively be, for example, 20 nm and 0.5 μm.

Figure 1C:
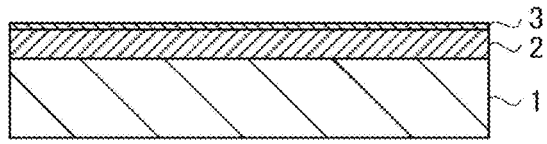

Next, a metal layer 3 is formed on the underlying layer 2, as illustrated in FIG. 1C. The metal layer 3 may be formed by, for example, vapor deposition of titanium (Ti) in an amount of a thickness of 20 nm.

Figure 1D:
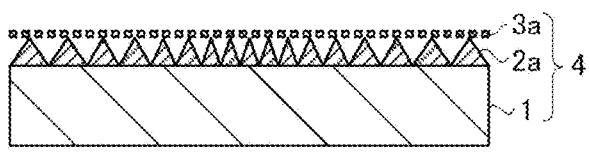

Next, heat treatment is carried out to nitride the metal layer 3 so as to form a nanomask 3a and to form voids in the underlying layer 2 so as to form a void-including layer 2a, as illustrated in FIG. 1D. The heat treatment may be carried out in the following way, for example. The underlying substrate 1 on which the underlying layer 2 and the metal layer 3 have been formed is put in an electric furnace and placed on a susceptor having a heater. The underlying substrate 1 is then heated in an atmosphere containing hydrogen gas ($H_2$ gas) or hydride gas. Specifically, heat treatment may be carried out, for example, for 20 minutes in an $H_2$ gas flow containing 20% of $NH_3$ gas as nitrided gas and at a prescribed temperature, for example, a temperature between 850° C. and 1,100° C. (inclusive).

Nitridation of the metal layer 3 due to such heat treatment results in the formation of a nanomask 3a, the surface of which has highly densely formed fine pores. Part of the underlying layer 2 is etched through the fine pores of the nanomask 3a, resulting in the formation of voids in the underlying layer 2 and thus in the formation of the void-including layer 2a. In this way, a substrate 4 in which voids are formed ("void-formed substrate 4" below) is produced that includes the void-including layer 2a and the nanomask 3a formed on the underlying substrate 1.

Preferably, the heat treatment is carried out in the following way. The heat treatment is carried out such that the "void formation rate (volume porosity)" indicative of the proportion in volume of the voids in the void-including layer 2a is uniform on the underlying substrate 1 in the circumferential direction. Specifically, the susceptor on which the underlying substrate 1 is placed may be rotated, for example, so as to carry out heat treatment uniformly in the circumferential direction. It is also possible to, for example, adjust the degree to which the heater heats the face of the underlying substrate 1, thereby making the temperature distribution in the epitaxial substrate uniform in the circumferential direction. Furthermore, the heat treatment is carried out such that the void formation rate in the void-including layer 2a increases steadily from the center of the underlying substrate 1 toward the outer circumference thereof in the radial direction. Specifically, the degree to which the heater heats the face of the underlying substrate 1 may be adjusted, for example, so that the temperature of the underlying substrate 1 increases monotonically from the center of the underlying substrate 1 toward the outer circumference thereof in the radial direction.

Figure 1E:
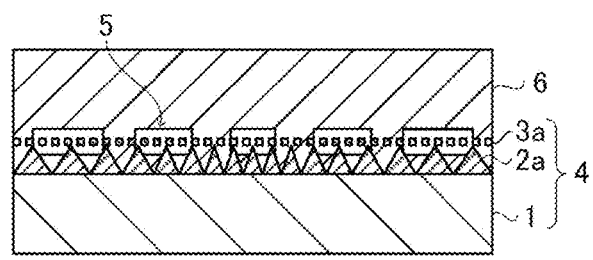
Figure 2:
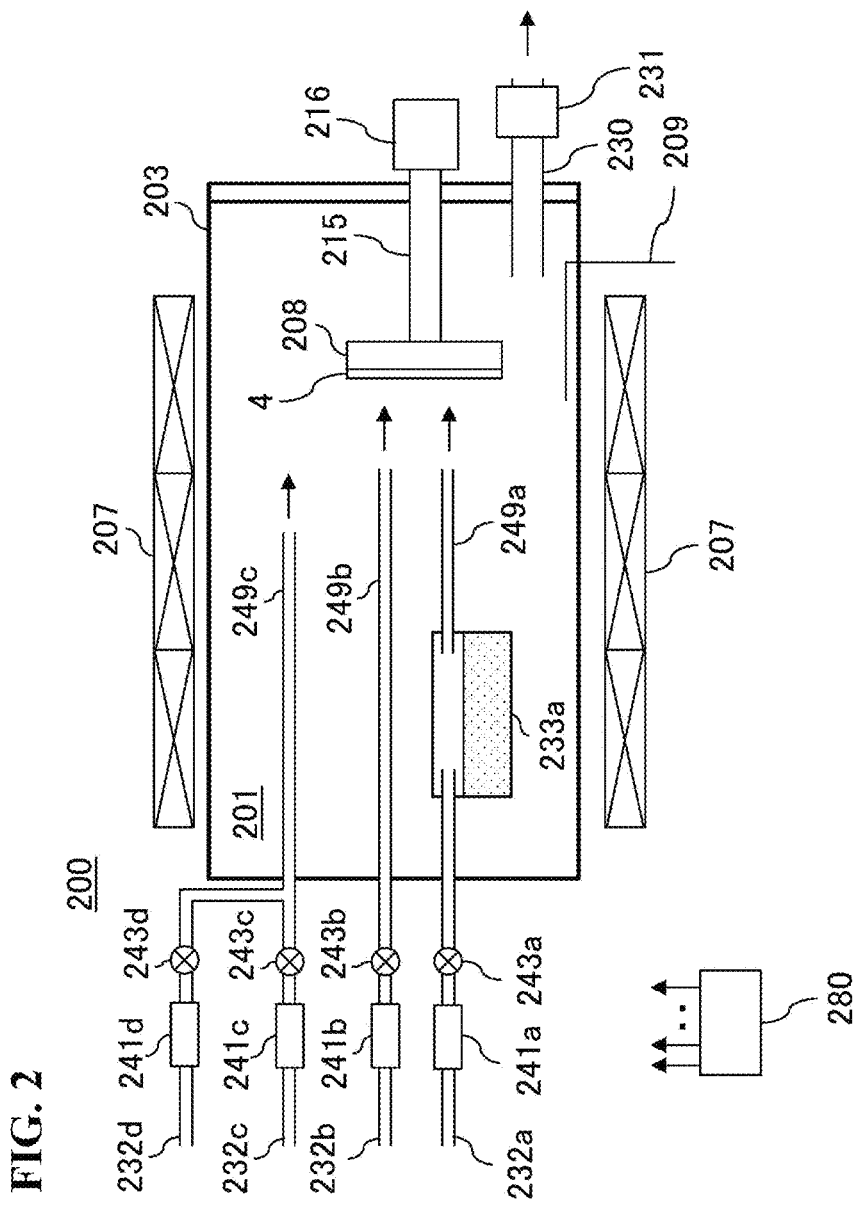
FIG. 2 is a schematic structural diagram illustrating an example of an HVPE device.

Next, a crystal 6 is grown on the nanomask 3a of the void-formed substrate 4, as illustrated in FIG. 1E. The crystal 6 is grown by a gas phase method, specifically by a hydride vapor phase epitaxy (HVPE) method. In this regard, an HVPE device 200 will be now described. FIG. 2 is a schematic structural diagram illustrating an example of the HVPE device 200.

The HVPE device 200 is formed from a heat-resistant material, such as quartz, and includes a hermetic container 203, the interior of which is provided with a film formation chamber 201. A susceptor 208 serving to hold the void-formed substrate 4 subject to treatment is provided inside the film formation chamber 201. The susceptor 208 is connected to a rotary shaft 215 of a rotary mechanism 216 and is configured to be rotatable. Gas supply tubes 232a through 232c serving to supply hydrochloric acid (HCl) gas, NH$_3$ gas, and nitrogen gas (N$_2$ gas) into the film formation chamber 201 are connected to one end of the hermetic container 203. A gas supply tube 232d serving to supply hydrogen (H$_2$) gas is connected to the gas supply tube 232c. Flow rate control devices 241a through 241d and valves 243a through 243d are provided respectively on the gas supply tubes 232a through 232d in that order from an upstream side. A gas generation device 233a that accommodates a Ga melt as raw material is provided downstream of the gas supply tube 232a. A nozzle 249a is connected to the gas generation device 233a. The nozzle 249a serves to supply gallium chloride (GaCl) gas produced by reaction between HCl gas and the Ga melt toward the void-formed substrate 4 held on the susceptor 208. Nozzles 249b and 249c are connected respectively to the downstream side of the gas supply tubes 232b and 232c. The nozzles 249b and 249c serve to supply the various gases supplied from the gas supply tubes 232b and 232c toward the void-formed substrate 4 held on the susceptor 208. A gas discharge tube 230 serving to discharge the gas inside the film formation chamber 201 is provided on the other end of the hermetic container 203. A pump 231 is provided on the gas discharge tube 230. Zone heaters 207 serving to heat the interior of the gas generation device 233a and the void-formed substrate 4 held on the susceptor 208 to desired temperatures are provided around the outer periphery of the hermetic container 203, and a temperature sensor 209 serving to measure the temperature inside the film formation chamber 201 is provided in the hermetic container 203. The members included in the HVPE device 200 are connected to a controller 280 constituted by a computer and are configured such that the processing procedures and processing conditions described later are controlled by a program that is executed on the controller 280.

The crystal 6 epitaxial processing may, for example, be implemented by the processing procedures below using the HVPE device 200. First, Ga is accommodated in the gas generation device 233a as raw material. The void-formed substrate 4 is placed and held on the susceptor 208. Then, a gas mixture containing H$_2$ gas and N$_2$ gas is supplied into the film formation chamber 201 while the film formation chamber 201 is being heated and gas is being discharged therefrom. In a state where the film formation temperature and the film formation pressure inside the film formation chamber 201 have reached the desired temperature and pressure and the atmosphere inside the film formation chamber 201 has become the desired atmosphere, gas supply from the gas supply tubes 232a and 232b is carried out such that GaCl gas and NH$_3$ gas are supplied to the void-formed substrate 4 as film formation gases.

The processing conditions for the crystal 6 epitaxial processing may be as follows, for example.

Growth temperature Tg: 980° C.-1,100° C., preferably 1,050° C.-1,100° C.

Pressure inside film formation chamber 201: 90-105 kPa, preferably 90-95 kPa

GaCl gas partial pressure: 1.5-15 kPa

NH$_3$ gas partial pressure/GaCl gas partial pressure: 4-20

N$_2$ gas partial pressure/H$_2$ gas partial pressure: 1-20

In the epitaxial processing, the GaN crystal that started to grow from the void-including layer 2a appear on the surface through the fine pores of the nanomask 3a, resulting in the formation of initial nuclei on the nanomask 3a. The growth of the initial nuclei in the thickness direction (vertical direction) as well as the in-plane direction (horizontal direction) and bonding of the same in the plane results in the formation of the crystal 6 constituted by a continuous film formed from a GaN single crystal. In areas where no initial nuclei are formed, voids 5 are formed between the nanomask 3a and the crystal 6 according to the presence of the voids in the void-including layer 2a. Since the void formation rate in the void-including layer 2a is controlled in the aforementioned way, the voids 5 are formed uniformly in the circumferential direction and become larger from the center toward the outside in the radial direction.

In this epitaxial processing, the crystal 6 is grown on the void-formed substrate 4, so the distribution of initial nucleus generation density can be made more uniform compared to the epitaxially lateral overgrowth (ELO) method employing a stripe mask or other such methods in which the distribution of initial nucleus generation density is made non-uniform to create dislocation concentration areas in which local dislocation density is extremely high (for example, $1\times10^7/cm^2$ or more). Accordingly, in-plane maximum dislocation density can be limited to a low value (for example, lower than $1\times10^7/cm^2$).

Moreover, in the epitaxial processing, GaN crystal growing from the void-including layer 2a appears on the surface through the fine pores of the nanomask 3a more readily toward the center in the radial direction where the void formation rate is lower, thus initial nuclei tend to form earlier toward the center. In other words, GaN crystal growing from the void-including layer 2a appears on the surface through the fine pores of the nanomask 3a less readily toward the outside in the radial direction where the void formation rate is higher, thus initial nuclei tend to form later toward the outside. Accordingly, the growth and boding of the initial nuclei can be made to progress gradually from the center toward the outside in the radial direction, so it is easier to grow the initial nuclei into a larger size. Furthermore, since such growth and bonding of the initial nuclei can be made to progress uniformly in the circumferential direction, crystal quality such as the in-plane uniformity of the crystal 6 can be enhanced.

Preferably, the crystal 6 grown has a thickness that enables at least one independent substrate 10 to be obtained from the crystal 6, for example, a thickness of 0.2 mm or more. There are no particular limitations on the upper limit of the thickness of the crystal 6 grown.

Figure 1F:
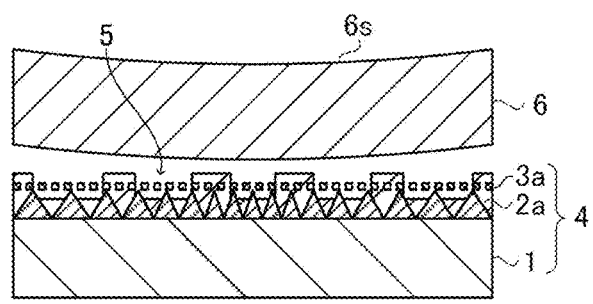

Next, the crystal 6 is peeled off from the void-formed substrate 4, as illustrated in FIG. 1F. This peeling is achieved during growth of the crystal 6 or in the process of cooling the interior of the film formation chamber 201 after completion of the growth of the crystal 6 as a result of the crystal 6 peeling off spontaneously from the void-formed substrate 4; here, the voids 5 formed between the crystal 6 and the nanomask 3a serve as the boundary of peeling.

Force, which is the result of mutual attraction of the initial nuclei bonding together during growth of the crystal 6, occurs in the crystal 6, so the crystal 6 contains tensile stress thereinside. Due to this tensile stress, the crystal 6 having peeled off warps in the manner of the growth-side surface thereof being depressed. Accordingly, the c face of the GaN single crystal constituting the crystal 6 that has peeled off curves in the form of a depressed spherical surface relative to an imaginary plane that is perpendicular to a direction normal to the center of a principal face 6s of the crystal 6. "Spherical surface" as referred to herein means a curved surface that approximates a spherical surface. "Approximates a spherical surface" as referred to herein means approximating the spherical surface of a true circle or an ellipse with an error falling within a prescribed error range.

Since the voids 5 are formed uniformly in the circumferential direction and so as to become larger from the center toward the outside in the radial direction, the crystal 6 can peel off uniformly from the outer circumference toward the center of the void-formed substrate 4 in the circumferential direction. Accordingly, natural peeling that is in conformity with the warping shape of the crystal 6 can be achieved, and therefore, the generation of unwanted stress that result from peeling can be limited. So, in this production method, as described above, crystal growth is carried out employing a VAS method while controlling the void formation rate in the aforementioned way; thus, a crystal 6 with enhanced crystal quality such as in-plane uniformity can be obtained.

After completion of the growth of the crystal 6 having a prescribed thickness, supply of the various gases used for the epitaxial processing is stopped and the atmosphere inside the film formation chamber 201 is substituted with $N_2$ gas to recover the atmospheric pressure. The void-formed substrate 4 and the crystal 6 are drawn out of the film formation chamber 201 after the temperature inside the film formation chamber 201 has been lowered to a temperature at which such draw-out work is possible.

Figure 1G:
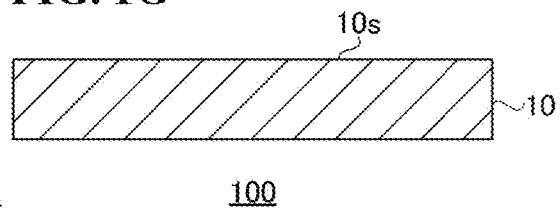

Next, the crystal 6 is machined (for example, cut with a wire saw) and rubbed, as appropriate, to obtain one or more substrates 10 from the crystal 6, as illustrated in FIG. 1G. The crystal face with a low index closest to the principal face 10s of the substrate 10 illustrated in FIG. 1G as an example is the c face.

The substrate 10 is produced in the aforementioned way. In addition to having a maximum dislocation density limited to be lower than $1 \times 10^7/cm^2$ (i.e. having no areas where the dislocation density reaches or exceeds $1 \times 10^7/cm^2$), the substrate 10 has high in-plane uniformity. The following describes an example of a specific condition that represents a "limited" dislocation density of the substrate 10. In the principal face 10s of the substrate 10, measurement is carried out using the cathodoluminescence (CL) method by scanning a 500 μm-diameter observation area within a 3 mm-square measurement area. The measurement is carried out on more or less ten such observation areas. At this time, the maximum dislocation density is lower than $1 \times 10^7/cm^2$, and in a preferred example, $5 \times 10^6/cm^2$ or lower. Preferably, an average dislocation density is $3 \times 10^6/cm^2$ or lower, for example. There are no particular limitations on a minimum dislocation density. The ratio of a maximum dislocation density to a minimum dislocation density may increase in conformity with a decrease in a minimum dislocation density, and as a rough standard, may be 100:1 or less, or 10:1 or less, for example.

The inventors of the present invention arrived at the finding that the substrate 10 constituting the GaN material 100 according to the first embodiment is a suitable material to be processed using PEC etching to form a recess with superior internal flatness (i.e. flatness of the internal faces of the recess). The PEC etching and the internal flatness of the formed recess will be described in detail later. The principal face 10s may be used as an example of a face in which such a recess is formed using PEC etching (also referred to as an "etched face" below).

Impurities may be added to the substrate 10. If impurities are to be added, a gas supply tube and the like for supplying gas that contains such impurities may be additionally provided in the HVPE device 200 illustrated in FIG. 2. Examples of such impurities include those serving to impart electroconductivity to the substrate 10, and may be n-type impurities, for example. Usable examples of n-type impurities include silicon (Si) and germanium (Ge). If Si is to be added, for example, then dichlorosilane ($SiH_2Cl_2$) may be used as Si raw material, for example. Impurities may also be those serving to impart semi-insulating properties to the substrate 10, for example.

Second Embodiment

Figure 3:
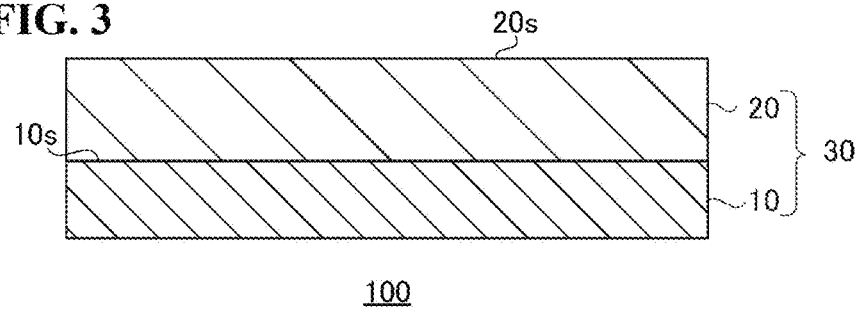
FIG. 3 is a schematic sectional diagram illustrating a GaN material (epitaxial substrate) according to a second embodiment.

Next, a second embodiment will be described. In the second embodiment, a first experimental example will also be described together. In the second embodiment, as illustrated in FIG. 3, a stack 30 (also referred to as an "epitaxial substrate 30" below), which includes a substrate 10 and a GaN layer 20 that is epitaxially grown (also referred to as an "epitaxial layer" below) on the substrate 10, is illustrated as an example of the GaN material 100. For the substrate 10, the substrate 10 described in the first embodiment may be used preferably.

The second embodiment features an example case where n-type impurities are added to both the substrate 10 and the epitaxial layer 20. Although there are no particular limitations on the constitution of the substrate 10 and the epitaxial layer 20, the following illustrates a possible example. In the substrate 10, Si may be added as an example of n-type impurities at a concentration of between $1 \times 10^{18}/cm^3$ and $1 \times 10^{19}/cm^3$ (inclusive). In the epitaxial layer 20, Si, for example, may be added at a concentration of between $3 \times 10^{15}/cm^3$ and $5 \times 10^{16}/cm^3$ (inclusive). When the epitaxial substrate 30 is to be used as a material for a semiconductor device, the substrate 10 would presumably be used as a contact layer for contact with an electrode and the epitaxial layer 20 would presumably be used as a drift layer, and it is preferred that the concentration of the n-type impurities added to the epitaxial layer 20 be lower than that of the substrate 10 from the view point of an increase in pressure-withstanding performance. Although not particularly limited, the thickness of the substrate 10 may be 400 μm, for example. The thickness of the epitaxial layer 20 may be between 10 μm and 30 μm (inclusive), for example. The epitaxial layer 20 may be constituted by a stack of multiple GaN layers having differing n-type impurity concentrations.

The epitaxial layer 20 may be grown on the principal face 10s of the substrate 10 by MOVPE, for example. TMG may be used as an example of Ga raw material, $NH_3$ may be used as an example of N raw material, and monosilane ($SiH_4$)

may be used as an example of Si raw material. The epitaxial layer 20 grows incorporating the crystallinity of the substrate 10, so similarly to the substrate 10, has its maximum dislocation density limited to be lower than $1 \times 10^7/\text{cm}^2$ while also having high in-plane uniformity.

The inventors of the present invention arrived at the finding that the epitaxial substrate 30 constituting the GaN material 100 according to the second embodiment is a suitable material to be processed using PEC etching to form a recess with superior internal flatness, as will be described in detail in the first experimental example below.

Figure 4:
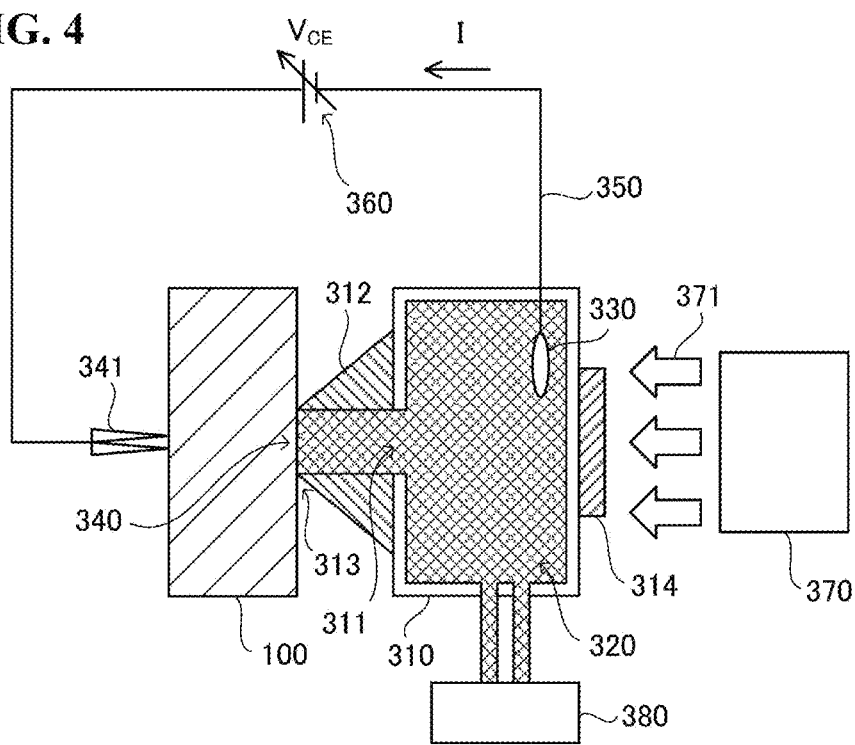
FIG. 4 is a schematic structural diagram illustrating an example of an electrochemical cell in a first experimental example.

Now, PEC etching and the internal flatness of the recess formed using PEC etching will be described along the first experimental example. FIG. 4 is a schematic structural diagram illustrating an example of an electrochemical cell 300 used in PEC etching. A container 310 stores an electrolyte solution 320. As an example of the electrolyte solution 320, a 0.01 M sodium hydroxide (NaOH) solution to which 1% of Triton (registered trademark) X-100 (by Sigma Chemical) has been added as a surfactant may be used.

A platinum (Pt) coil may be used as an example of a cathode electrode 330. The cathode electrode 330 is disposed in the electrolyte solution 320. The GaN material 100 is used as an anode electrode 340. The container 310 has an opening 311, and a sealing ring 312 is disposed so as to surround the opening 311 and be interposed between the container 310 and the GaN material 100. The GaN material 100 is disposed so as to close an opening 313 of the sealing ring 312 located on the opposite side from the container 310. Accordingly, the GaN material 100 contacts the electrolyte solution 320 filling the hole of the sealing ring 312. An ohmic contact probe 341 is attached to the GaN material 100 (anode electrode 340) so as not to contact the electrolyte solution 320.

The cathode electrode 330 and the ohmic contact probe 341 attached to the anode electrode 340 are connected to each other by a wire 350. A voltage source 360 is inserted partway through the wire 350. The voltage source 360 applies a prescribed etching voltage between the cathode electrode 330 and the anode electrode 340 at a prescribed timing.

A light source 370 is disposed on the outside of the container 310. The light source 370 emits ultraviolet (UV) light 371 having a prescribed irradiation intensity at a prescribed timing. Usable examples of the light source 370 include mercury xenon (Hg—Xe) lamps (for example, LIGHTNINGCURE (registered trademark) L9566-03 (by Hamamatsu Photonics K.K.)). A window 314 allowing the UV light 371 to pass through is provided on the container 310. The UV light 371 emitted from the light source 370 passes through the window 314, the electrolyte solution 320, the opening 311 of the container 310, and the opening 313 of the sealing ring 312 and irradiates the GaN material 100 (anode electrode 340). A pump 380 is attached to the container 310. The pump 380 agitates the electrolyte solution 320 in the container 310 at a prescribed timing.

As the anode electrode 340 is irradiated with the UV light 371, the following reaction progresses in the anode electrode 340 and the cathode electrode 330. In the anode electrode 340, holes resulting from the UV light 371 irradiation resolve the GaN into $Ga^{3+}$ and $N_2$ (chem. 1), and moreover, $Ga^{3+}$ is oxidized by the $OH^-$ group (chem. 2), resulting in the generation of gallium oxide ($Ga_2O_3$). As a result of the generated $Ga_2O_3$ being dissolved by the NaOH solution (electrolyte solution 320), the anode electrode 340, i.e. the GaN material 100, is etched. PEC etching is carried out in this way.

(Anode Reaction)

$GaN(s) + 3h^+ \rightarrow Ga^{3+} + \frac{1}{2}N_2(g)\uparrow$     [Chemical Formula 1]

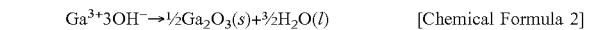
$Ga^{3+} + 3OH^- \rightarrow \frac{1}{2}Ga_2O_3(s) + \frac{3}{2}H_2O(l)$     [Chemical Formula 2]

$H_2O(l) + 2e^- \rightarrow 2OH^- + H_2(g)\uparrow$     [Chemical Formula 3]

(Cathode Reaction)

$2H_2O(l) + 2e^- \rightarrow 2OH^- + H_2(g)\uparrow$     [Chemical Formula 4]

In the first experimental example, specifically, the epitaxial substrate 30 was used as the GaN material 100 constituting the anode electrode 340. For more detailed description, the epitaxial layer 20 was irradiated with the UV light 371 while the epitaxial layer 20 side of the epitaxial substrate 30 was contacting the electrolyte solution 320, thereby causing anodic oxidation at the epitaxial layer 20 to etch the same. In other words, the principal face 20*s* of the epitaxial layer 20 was used as an etched face.

In the first experimental example, a GaN substrate having a Si concentration of 1 to $2 \times 10^{18}/\text{cm}^3$ was used as the substrate 10. The epitaxial layer 20 was formed by growing a GaN layer having a Si concentration of $2 \times 10^{18}/\text{cm}^3$ and a thickness of 2 µm and a GaN layer having a Si concentration of $9 \times 10^{15}/\text{cm}^3$ and a thickness of 13 µm on the substrate 10 by MOVPE. The overall size of the epitaxial substrate 30 was set to be a diameter of 2 inches (5.08 cm) and the size of the area to be etched by the electrolyte solution 320 coming into contact with the epitaxial layer 20, i.e. the size of the opening 313 of the hole of the sealing ring 312, was set to a diameter of 3.5 mm.

The irradiation intensity at the etched face was set to be 9 mW/cm². UV light irradiation and application of the etching voltage were repeated intermittently by repeating a set consisting of: carrying out UV light irradiation and application of the etching voltage simultaneously for 13 seconds; and then stopping the same for 9 seconds. In other words, pulsed anodic oxidation was carried out. The etching voltage was changed from 0 V to 1 V, 2 V, and 3 V to confirm changes resulting therefrom in the flatness of the bottom face of the recess formed using PEC etching. Results of the first experimental example will be described below with reference to FIGS. 5 through 13.

In commercially available devices designed to carry out PEC etching on various materials, it is common to set the etching voltage to a high voltage exceeding 3 V. A characteristic of this experimental example lies in that a low etching voltage range of 3 V or lower is adopted.

Figure 5:
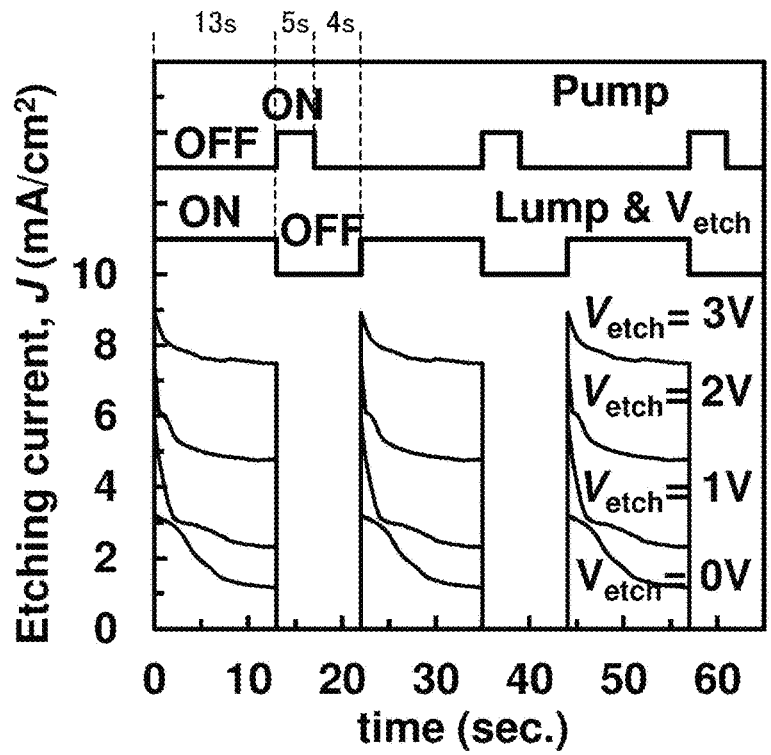
FIG. 5 is a timing chart illustrating a sequence of PEC etching in the first experimental example.

FIG. 5 is a timing chart illustrating a sequence of PEC etching. As mentioned above, UV light irradiation and application of the etching voltage were repeated intermittently by repeating a set consisting of: carrying out UV light irradiation ("Lump" in the drawings) and application of the etching voltage ("$V_{etch}$" in the drawings) simultaneously for 13 seconds; and then stopping the same for 9 seconds. The pump 380 is used to agitate the electrolyte solution 320 ("Pump" in the drawings) within the period in which UV light irradiation and the application of the etching voltage are stopped, more specifically, in the first 5 seconds of this period.

The lower part of FIG. 5 illustrates the etching currents corresponding to cases where the etching voltages of 0 V, 1 V, 2 V, and 3 V were used. For all etching voltages, an etching current flows during the UV light irradiation period and does not flow during the UV light stoppage period. During the UV light irradiation period, an etching current flows as a result of the OH⁻ group reaching the anode electrode 340 according to the aforementioned anode reaction, even if the etching voltage is 0 V. An increase in the etching voltage results in an increase in a drive force of attracting the OH⁻ group toward the anode electrode 340, leading to an increase in the etching current.

Figure 6:
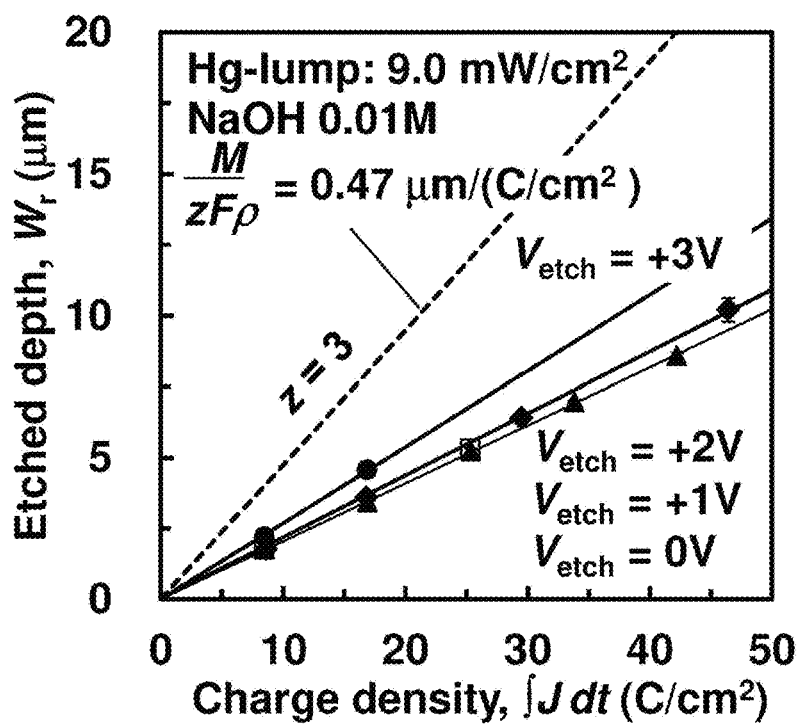
FIG. 6 is a graph illustrating a relationship between an amount of charge per unit area consumed by anodic oxidation and etched depth in the first experimental example.

FIG. 6 is a graph illustrating a relationship between an amount of charge per unit area consumed by anodic oxidation and etched depth (etch depth, etching depth). The result corresponding to the 0 V-etching voltage is illustrated with a square plot, and likewise, 1 V-etching voltage: triangular plot, 2 V-etching voltage: rhombic plot, and 3 V-etching voltage: circular plot. The same plotting is used in FIG. 7 that will be described later.

Etched depth was measured using a step profiler (Sloan, Dektak3 ST). It can be seen that the etched depth changes linearly in relation to the consumed amount of charge. The etched depth $W_r$ is expressed as

[Formula 1]

$$W_r = M/zF\rho \int J dt \quad (1)$$

according to the Faraday's law. Here, "M" expresses the molecular weight of GaN, "z" expresses the required valence for anodic oxidation per 1 mol of GaN, "F" expresses a Faraday constant, "ρ" expresses the density of GaN, and "J" expresses etching current density. According to expression (1), the hole necessary for anodic oxidation of 1 mol of GaN is z=5.3-6.8 mol. For the generation of $Ga_2O_3$ (chem. 1 and chem. 2) alone, z=3 mol. Thus, this result indicates that in the anode electrode 340, oxygen gas is generated in addition to the generation of $Ga_2O_3$ and the hole is consumed.

Figure 7:
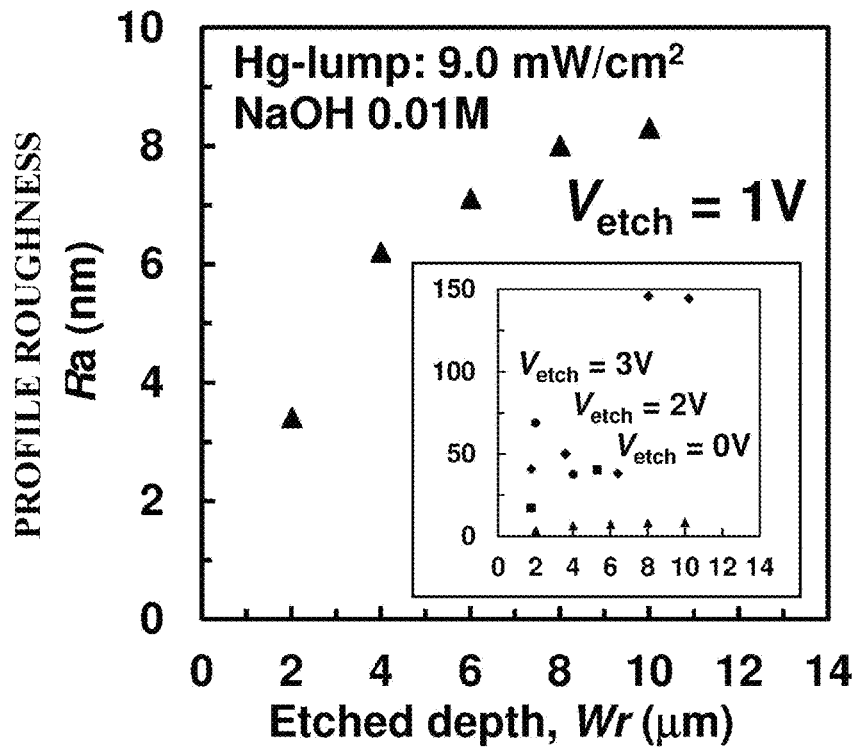
FIG. 7 is a graph illustrating a relationship between etched depth and profile roughness Ra of a bottom face of a formed recess in the first experimental example.

FIG. 7 is a graph illustrating a relationship between etched depth and calculated average profile roughness Ra (may be referred to simply as "profile roughness Ra" in this specification) of a bottom face of a formed recess in the first experimental example. The profile roughness Ra was measured with a contact-type step profiler (Sloan, Dektak3 ST). In the measurement with the contact-type step profiler, the profile roughness Ra was calculated by using, within the evaluation length of 500 μm, 100 μm as a reference length. In other words, the measurement length for obtaining the profile roughness Ra was set to be 100 μm. In FIG. 7, the results obtained with the etching voltage of 1 V are illustrated in enlarged fashion as representative results, and together therewith, the results for the etching voltages of 0 V, 2 V, and 3 V are illustrated in reduced fashion in the lower right part.

It can be seen that in the range in which the etched depths are between 0 μm and 10 μm (inclusive), the profile roughness Ra for the etching voltage of 1 V is remarkably small for all depths. For example, for the etched depth of 10 μm, while the profile roughness Ra for the etching voltage of 2 V is about 150 nm, the profile roughness Ra for the etching voltage of 1 V is as extremely small as 10 nm or less, specifically about 8 nm. In other words, it can be seen that the flatness of the bottom face of the recess formed with the etching voltage of 1 V is remarkably superior. It should be noted that an increase in the depth of a recess tends to result in a decrease in the flatness of the bottom face.

Figure 8:
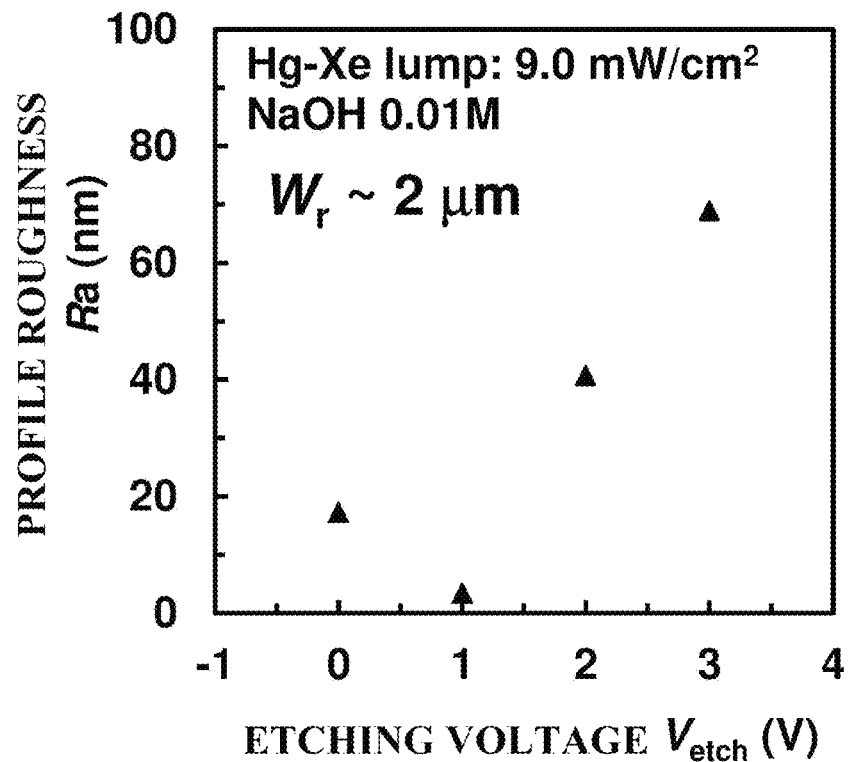
FIG. 8 is a graph illustrating a relationship between an etching voltage and profile roughness Ra in the first experimental example in a case where the etched depth is 2 μm.
Figure 9:
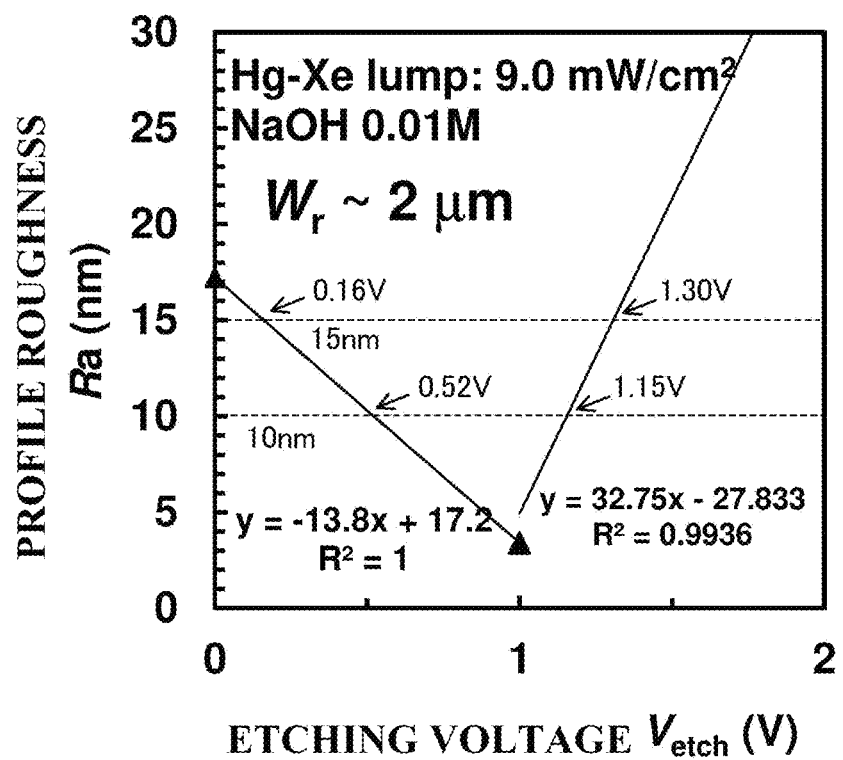
FIG. 9 is a graph in which etching voltage 1 V and the vicinity thereof in FIG. 8 are enlarged.

FIG. 8 is a graph illustrating a relationship between an etching voltage and profile roughness Ra in a case where the etched depth is 2 μm (a graph in which the results for the etched depth of 2 μm in FIG. 7 are plotted anew). FIG. 9 is a graph in which the etching voltage of 1 V and the vicinity thereof in FIG. 8 are enlarged.

The profile roughness Ra is 17 nm, 3.5 nm, 40 nm, and 70 nm for the etching voltages of 0 V, 1 V, 2 V, and 3 V, respectively. For the etching voltage of 1 V, a very flat bottom face with a profile roughness Ra of no more than 5 nm is obtained. In view of this result, an etching voltage for which the profile roughness Ra will be no more than 15 nm, for example, can be estimated to be a voltage falling within the range of 0.16 V to 1.30 V (inclusive), whereas an etching voltage for which the profile roughness Ra will be no more than 10 nm, for example, can be estimated to be a voltage falling within the range of 0.52 V to 1.15 V (inclusive).

Figure 10A:
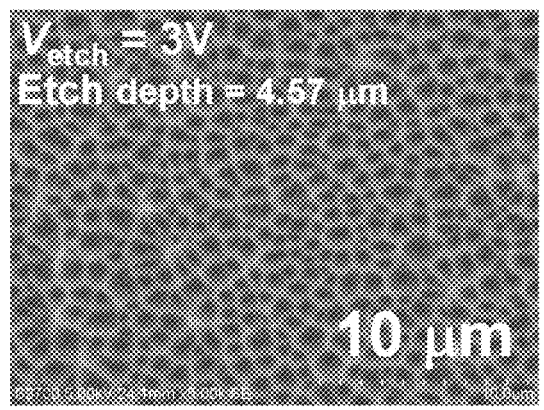
FIGS. 10A through 10C are SEM images of bottom faces of recesses formed in the first experimental example in cases where etching voltages are set to 3 V, 2 V, and 1 V.
Figure 10B:
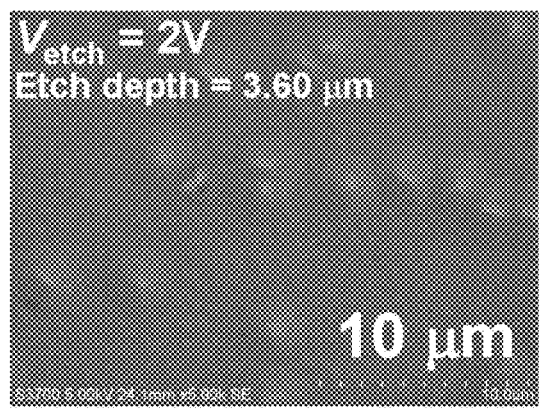
Figure 10C:
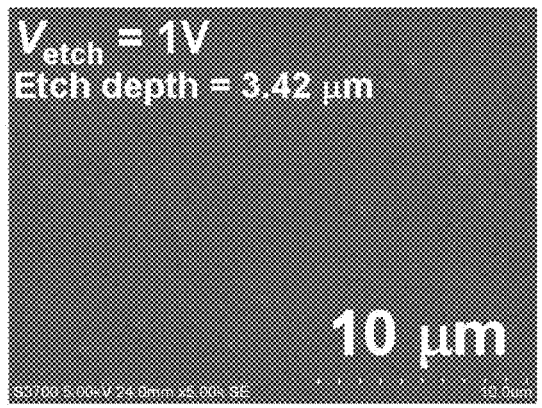
Figure 10D:
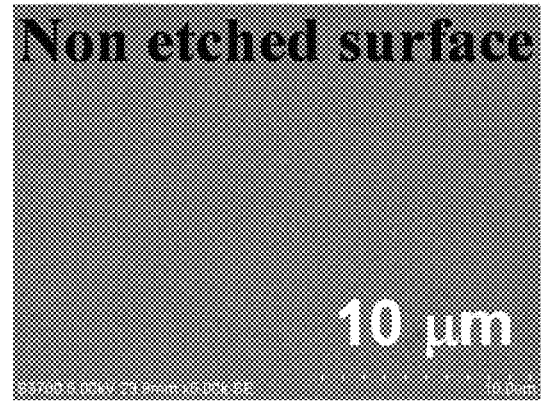
FIG. 10D is a SEM image of a surface in the first experimental example in a case where no etching is carried out.
Figure 11A:
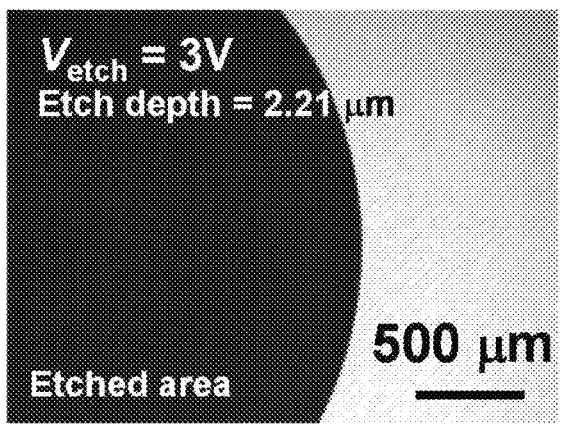
FIGS. 11A through 11D are optical microscopic images of bottom faces of recesses formed in the first experimental example in cases where etching voltages are set to 3 V, 2 V, 1 V, and 0 V.
Figure 11B:
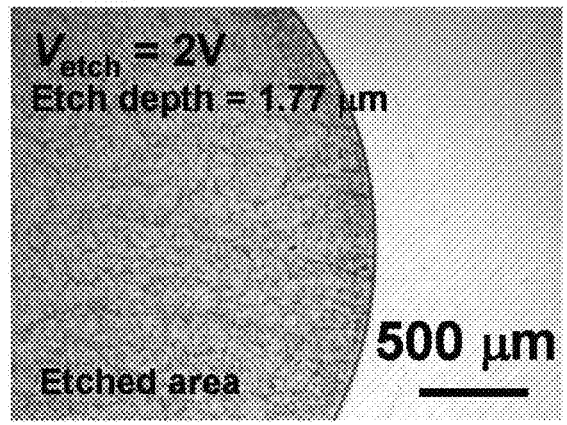
Figure 11C:
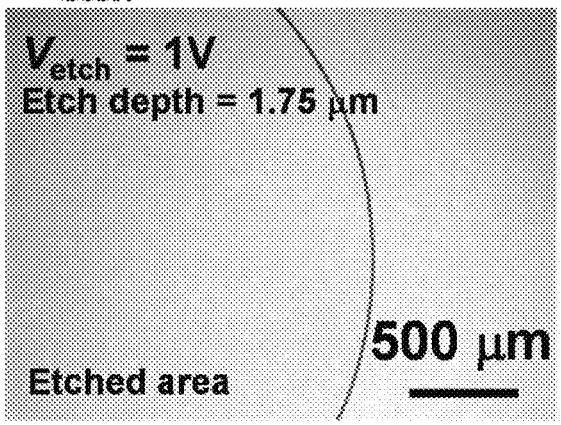
Figure 11D:
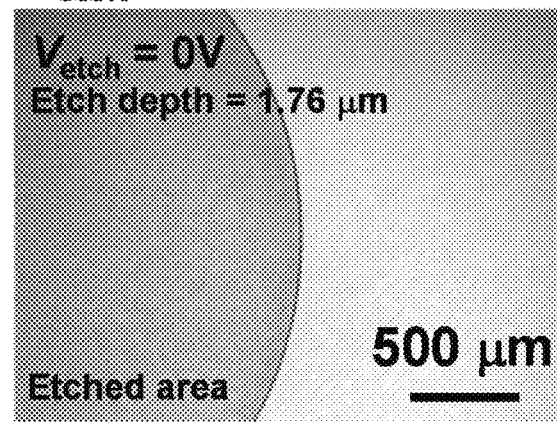
Figure 12A:
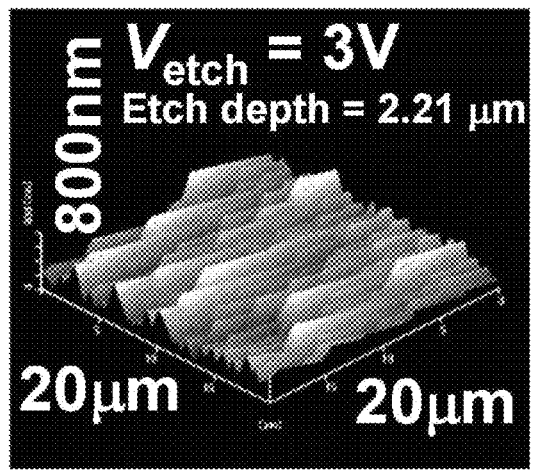
FIGS. 12A through 12D are AFM images of the bottom faces of the recesses formed in the first experimental example in the cases where the etching voltages are set to 3 V, 2 V, 1 V, and 0 V.
Figure 12B:
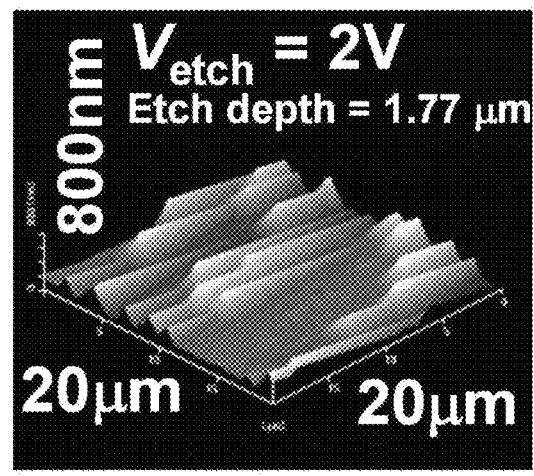
Figure 12C:
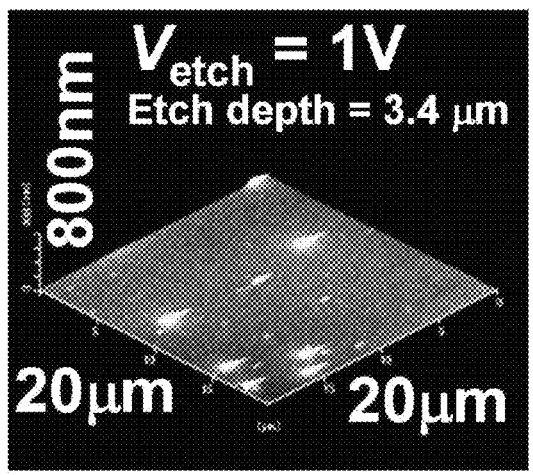
Figure 12D:
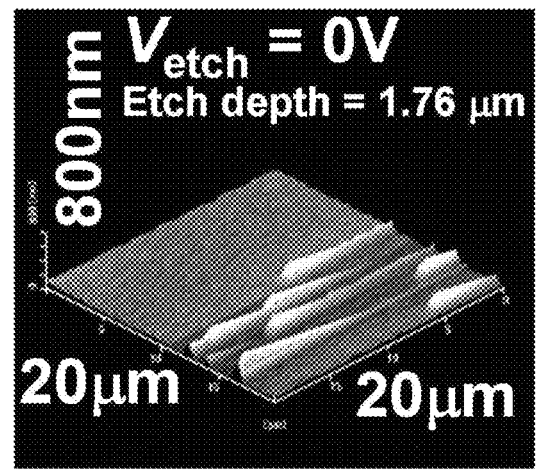

FIGS. 10A through 10C are scanning electron microscopic (SEM) images of bottom faces of recesses formed in cases where the etching voltages are set to 3 V, 2 V, and 1 V. FIG. 10D is a SEM image obtained in a case where no etching is carried out. It can be seen that the bottom face of the recess has superior flatness for the etching voltage of 1 V.

FIGS. 11A through 11D are optical microscopic images of bottom faces of recesses formed in cases where the etching voltages are set to 3 V, 2 V, 1 V, and 0 V. The circular area illustrated in the left part of each image illustrates the etched area, i.e. the recess. It can be seen that for the etching voltage of 1 V, the bottom face of the recess has superior flatness over a wide area of, for example, 500 μm square or more or, for example, 1 mm square or more.

FIGS. 12A through 12D are atomic force microscopic (AFM) images of the bottom faces of the recesses formed in the cases where the etching voltages are set to 3 V, 2 V, 1 V, and 0 V. It can be seen that the bottom face of the recess has superior flatness for the etching voltage of 1 V. For the etching voltage of 1 V, the calculated average surface roughness Ra for a 5 μm-square measurement area (area subject to evaluation) in the bottom face of the recess, as measured using AFM, is 2.6 nm. Meanwhile, for the etching voltage of 0 V, nonuniformity is observed in terms of the presence of both areas with relatively superior flatness and areas with relatively inferior flatness. It is inferred that the reason for this nonuniformity is that since no etching voltage is applied, the ease with which the OH⁻ group is supplied, i.e. the ease with which $Ga_2O_3$ is generated, differs from one area to another, resulting in the presence of areas that are etched more readily and areas that are etched less readily.

Figure 13:
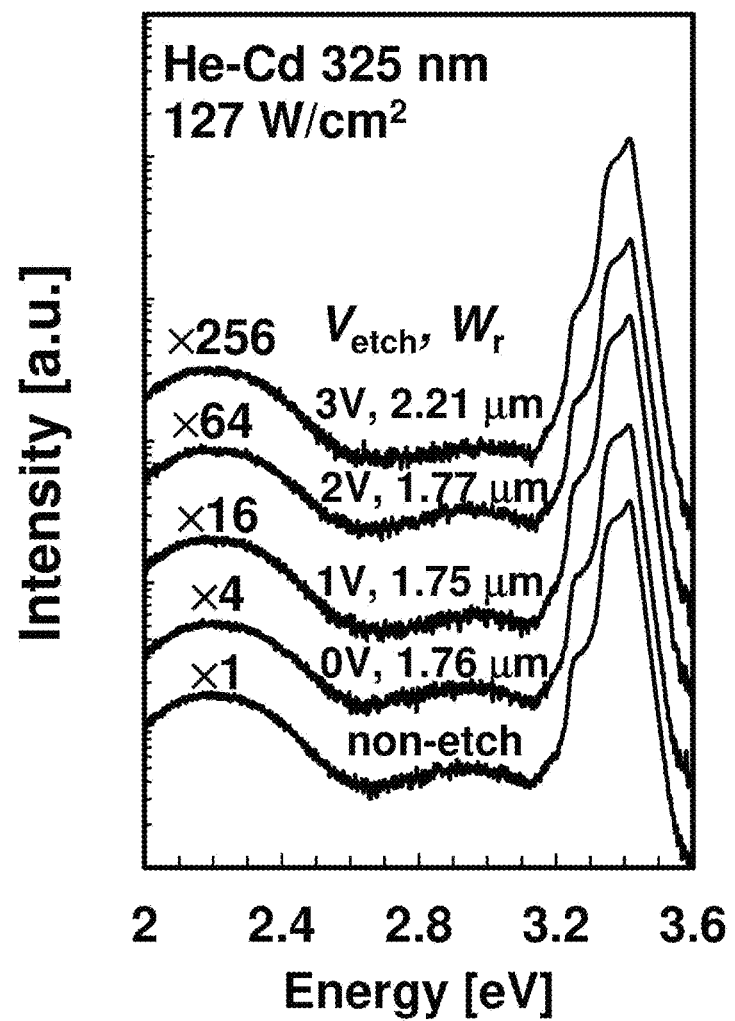
FIG. 13 illustrates PL emission spectra in the first experimental example in the cases where no etching is carried out and where the etching voltages are set to 0 V, 1 V, 2 V, and 3 V.

FIG. 13 is a graph illustrating how the photoluminescence (PL) characteristics of a GaN material change according to PEC etching and illustrates PL emission spectra in the cases where no etching is carried out and where the etching voltages are set to 0 V, 1 V, 2 V, and 3 V. The peak intensity of a PL emission spectrum at a band edge of GaN (about 3.4 eV) will be referred to as "band-edge peak intensity" here. The band-edge peak intensities for all etching voltages have an intensity that is 90% or more in relation to the band-edge peak intensity for when no etching was carried out. In other words, when any of those etching voltages are used, the rate of change (reduction) in band-edge peak intensity due to anodic oxidation is less than 10%. Thus, as can be seen, the PEC etching has demonstrated itself as being a method with which GaN material can be processed with almost no damage to the GaN crystal.

Results obtained in the first experimental example can be summarized as follows. When a recess is formed in the GaN material 100 using PEC etching while changing the etching voltage from 0 V to 1 V, 2 V, and 3 V, the flatness of the bottom face of the recess is superior for the etching voltage of 1 V above all. It is inferred that if the etching voltage is excessively high, for example 2 V or 3 V, the etching is intense, and this leads to a decrease in the flatness of the bottom face of the recess. Meanwhile, it is inferred that if the etching voltage is excessively low, 0 V, then areas that are etched more readily and areas that are etched less readily occur, and this also leads to a decrease in the flatness of the bottom face of the recess.

It is inferred that if the etching voltage is about 1 V, the etching is appropriate, and this leads to an increase in the flatness of the bottom face of the recess. To give a specific example, for the purpose of providing a rough standard for obtaining a profile roughness Ra of about 15 nm or less for the bottom face of a recess to be formed, it is preferred that the etching voltage be a voltage falling within the range of 0.16 V to 1.30 V (inclusive). To give another example, for the purpose of providing a rough standard for obtaining a profile roughness Ra of about 10 nm or less for the bottom face of a recess to be formed, it is preferred that the etching voltage be a voltage falling within the range of 0.52 V to 1.15 V (inclusive).

As described above, in the first experimental example, PEC etching that results in superior flatness could be carried out with an etching voltage of about 1 V. An etching voltage of about 1 V is significantly lower than etching voltages that are usually used for PEC etching, e.g. an etching voltage exceeding 3 V. It is considered that in order to make PEC etching with such a low etching voltage possible, it is preferred that, primarily, the dislocation density of the GaN material 100 in the etched face be adequately low (for example, the dislocation density be, at most, smaller than $1 \times 10^7/cm^2$, i.e. there be no areas having a dislocation density of $1 \times 10^7/cm^2$ or more); this is because in areas where the dislocation density is excessively high (for example, $1 \times 10^7/cm^2$ or more), the holes generated due to UV light irradiation are trapped, which inhibits anodic oxidation. In addition, in order to achieve etching resulting in superior flatness with such a low etching voltage, it is preferred that the in-plane uniformity of the GaN material 100 in the etched face be high so that nonuniformity in terms of the ease with which anodic oxidation occurs is limited.

In view of the above discussion, the profile roughness Ra of a bottom face of a recess formed using PEC etching can be used as an index for evaluating the characteristics (lowness of dislocation density and in-plane uniformity) of the GaN material 100. The GaN material 100 according to the first and second embodiments, i.e. the substrate 10 and the epitaxial substrate 30, is characterized by being a GaN material in which a recess with superior internal flatness can be formed using PEC etching. Specifically, the GaN material 100 according to the first and second embodiments constitutes a GaN material having a low dislocation density and high in-plane uniformity to a degree such that, when assuming a case where a recess with the depth of 2 μm is to be formed using PEC etching (etching voltage=1 V) while carrying out UV light irradiation, then the bottom face of the recess will be formed into a flat face having a profile roughness Ra of preferably 15 nm or less, more preferably 10 nm or less, yet more preferably 5 nm or less.

The surface of the GaN material 100 having undergone no etching ("non-etched surface" below) is flat to a degree such that the profile roughness Ra thereof is, for example, 0.5 nm. In other words, in a member obtained by forming a recess in the GaN material 100 using PEC etching (also referred to as a "GaN member" below), the non-etched surface consisting of an upper face on the outside of the recess is flat to a degree such that the profile roughness Ra thereof is, for example, 0.5 nm. The profile roughness Ra being preferably 15 nm or less, more preferably 10 nm or less, yet more preferably 5 nm or less as described above implies that the profile roughness Ra of the bottom face of the recess of the GaN member (GaN material 100) is preferably 30 times or less, more preferably 20 times or less, yet more preferably 10 times or less than the profile roughness Ra of the surface (non-etched surface) on the outside of the recess. Note that the bottom face of a recess, the etched depth of which is shallower than 2 μm, can be said to be more flat than the bottom face of a recess having a 2-μm etched depth. Thus, the aforementioned condition is applicable to the formation of not only a recess having a 2 μm-etched depth but also to a recess having an etched depth of less than or equal to 2 μm.

For a bottom face of a recess formed using PEC etching as described above, damage to the GaN crystal caused by the etching is little. Thus, for the GaN member (GaN material 100), the band-edge peak intensity of the PL emission spectrum for the bottom face of a recess has an intensity that is 90% or more in relation to the band-edge peak intensity of the PL emission spectrum for the surface on the outside of the recess (non-etched surface).

For the evaluation method described hereabove, the formation of a structure is assumed in which the "recess" is one that has a bottom face, i.e. the GaN material 100 is not penetrated through, but when actually carrying out processing using PEC etching, a structure may be formed where the GaN material 100 is penetrated through to form the "recess".

The etching voltage conditions revealed in the first experimental example are considered to be valid as a rough standard for improving the internal flatness of a recess for not only the PEC etching designed for the GaN material 100 according to the first and second embodiments, but also PEC etching that is performed on an area of a GaN material having an adequately low dislocation density (for example, less than $1 \times 10^7/cm^2$). That is to say, in cases where a recess is formed in an area of a GaN material having a dislocation density of, for example, less than $1 \times 10^7/cm^2$ using PEC etching through the application of etching voltage while carrying out UV light irradiation, the etching voltage is preferably within the range of 0.16 V to 1.30 V (inclusive), more preferably 0.52 V to 1.15 V (inclusive). Such a standard is especially useful when forming a deep recess that has a depth of, for example, 1 μm or more or, for example, 2 μm or more, where the flatness of the bottom face of the recess is prone to degradation. Meanwhile, such a standard is also useful when forming a shallow recess (having a depth of, for example, less than 1 μm), and the use of such a standard enables the formation of a bottom face of a recess having further superior flatness. This is because a decrease in etched depth results in an increase in the flatness of a bottom face of a recess.

For the purpose of increasing flatness, it is preferred that such PEC etching be carried out in the manner of an intermittent repetition of UV light irradiation and application of etching voltage. Moreover, to make it even more preferable, the electrolyte solution used for PEC etching is agitated during the period in which UV light irradiation and application of etching voltage are stopped.

In the first experimental example, flatness of the bottom face of a recess formed using PEC etching has been subject to evaluation; however, a bottom face being formed flat means etching conditions are appropriate and also implies that side faces are formed flat as well. In other words, carrying out PEC etching according to the conditions described above achieves an increase in the internal flatness of the recess formed.

For etching conditions to achieve superior flatness, an etching rate for PEC etching may be, for example, 24.9 nm/min. An etching rate and desired etched depth may be used to estimate an etching duration. Note that if flatness can be disregarded, a maximum etching rate for PEC etching may be raised to, for example, 175.5 nm/min.

In the first experimental example, the irradiation intensity of UV light at the etched face is 9 mW/cm$^2$. The irradiation intensity of 50 mW/cm$^2$ for mask aligners, for example, is a value commonly and widely employed for UV light irradiation intensity. The first experimental example is carried out under a condition that facilitates implementation, where the irradiation intensity at the etched face is, for example, no more than 50 mW/cm$^2$.

In the first experimental example, a NaOH solution having a concentration of 0.01 M is used as the electrolyte solution; however, the concentration of the electrolyte solution may be adjusted as appropriate. For example, if the concentration is made lower than 0.01 M (for example, about 0.003 M), the etching flatness can be further increased despite a decrease in the etching rate. Alternatively, the concentration may be made higher than 0.01 M to such an extent that appropriate etching flatness can be maintained (for example, 0.02 M or lower).

Third Embodiment

Figure 14A:
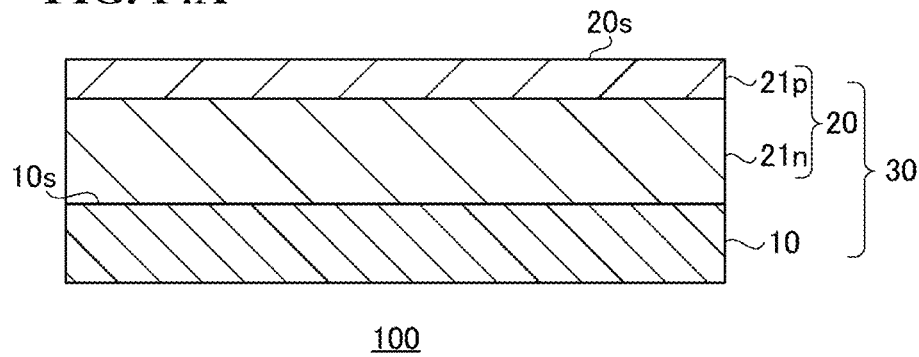
FIGS. 14A through 14C are schematic sectional diagrams illustrating part of a method for producing a semiconductor device employing a GaN material (epitaxial substrate) according to a third embodiment.

Next, a third embodiment will be described. The third embodiment features an epitaxial substrate 30 including a GaN substrate 10 and an epitaxial layer 20 as an example of a GaN material 100, as illustrated in FIG. 14A. The constitution of the epitaxial layer 20 according to the third embodiment differs from that of the epitaxial layer 20 according to the second embodiment in including a GaN layer 21n to which n-type impurities have been added (also referred to as an "epitaxial layer 21n" below) and a GaN layer 21p to which p-type impurities have been added (also referred to as an "epitaxial layer 21p" below). For the substrate 10, the substrate 10 described in the first embodiment may be used preferably.

Although there are no particular limitations on the constitution of the substrate 10 and the epitaxial layer 20 (epitaxial layers 21n and 21p), the following illustrates a possible example. For the substrate 10 and the epitaxial layer 21n, a constitution equivalent to that of the substrate 10 and the epitaxial layer 20 described in the second embodiment may be adopted as an example. For the p-type impurities, magnesium (Mg) may be used as an example. The epitaxial layer 21p may be constituted by, for example, a stack including: a GaN layer, which has a thickness of between 300 nm and 600 nm (inclusive), and to which Mg has been added at a concentration of between $2\times10^{17}$/cm$^3$ and $5\times10^{18}$/cm$^3$ (inclusive); and a GaN layer, which has a thickness of between 10 nm and 50 nm (inclusive), and to which Mg has been added at a concentration of between $1\times10^{20}$/cm$^3$ and $3\times10^{20}$/cm$^3$ (inclusive).

The epitaxial layer 20 (epitaxial layers 21n and 21p) may be grown on the principal face 10s of the substrate 10 by MOVPE, for example. Growth of the epitaxial layer 21n is equivalent to the growth of the epitaxial layer 20 described in the second embodiment. The epitaxial layer 21p is grown using TMG as an example of Ga raw material, NH$_3$ as an example of N raw material, and Bis-cyclopentadienyl magnesium (CP$_2$Mg) as an example of Mg raw material. The epitaxial layers 21n and 21p grow incorporating the crystallinity of the substrate 10, so similarly to the substrate 10, have the maximum dislocation density thereof limited to be lower than $1\times10^7$/cm$^2$ while also having high in-plane uniformity. The epitaxial substrate 30 constituting the GaN material 100 according to the third embodiment is a suitable material to be processed using PEC etching to form a recess with superior internal flatness, similarly to the GaN material 100 according to the first and second embodiments.

Figure 14B:
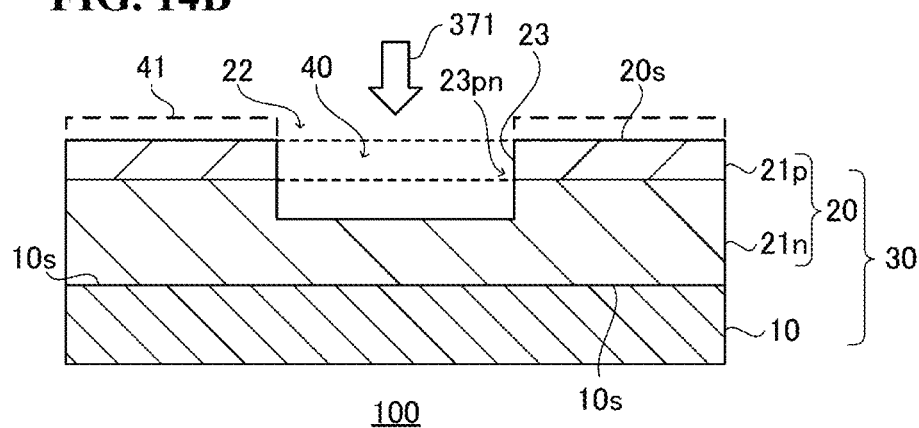

FIG. 14B illustrates PEC etching designed for the epitaxial substrate 30. A principal face 20s of the epitaxial layer 20 is used as an etched face. The epitaxial substrate 30 is disposed in the electrochemical cell 300 in such a way that an area 22 to be etched in the principal face 20s contacts the electrolyte solution 320. Then, PEC etching is carried out by applying etching voltage onto the area 22 while irradiating the same with UV light 371. In this example, a recess 40 is formed by penetrating through the epitaxial layer 21p and penetrating partway through the thickness of the epitaxial layer 21n. A pn junction 23pn constituted by the epitaxial layer 21p and the epitaxial layer 21n is exposed on a side face 23 of the recess 40. By setting the etching voltage to about 1 V as described above, a pn junction 23pn can be formed on a side face 23 having superior flatness. An area in the principal face 20s, which is located on the outside of the area 22 and is not subject to etching, may be covered with a mask 41 constituted by a hardmask or the like so as to be prevented from being etched. For the purpose of limiting unwanted etching (side etching) on the side face of the recess 40, the mask 41 may be constituted by a light-blocking mask and the linearity of the UV light 371 may be enhanced.

In cases where the epitaxial layer 20 includes an epitaxial layer 21p to which p-type impurities have been added as in the third embodiment, it is preferred that activation annealing for activating the p-type impurities in the epitaxial layer 21p be carried out after PEC etching for the following reason. When the epitaxial layer 21p is a p-type conductive layer, the epitaxial layer 21p itself has a hole, so PEC etching progresses more readily even without the UV light 371. As a result, a difference occurs between the epitaxial layer 21n and the epitaxial layer 21p in terms of the ease with which etching progresses. Furthermore, since side etching occurs more readily in the epitaxial layer 21p, the flatness of the side face 23 of the recess 40 is prone to degradation. For this reason, it is preferred that PEC etching be carried out before the epitaxial layer 21p is made into a p-type conductive layer, i.e. before subjecting the epitaxial layer 21p to activation annealing, from the viewpoint of improving flatness. In other words, it is preferred that activation annealing be carried out after PEC etching and that the epitaxial layer 21p when subjected to PEC etching has not undergone activation annealing.

Figure 14C:
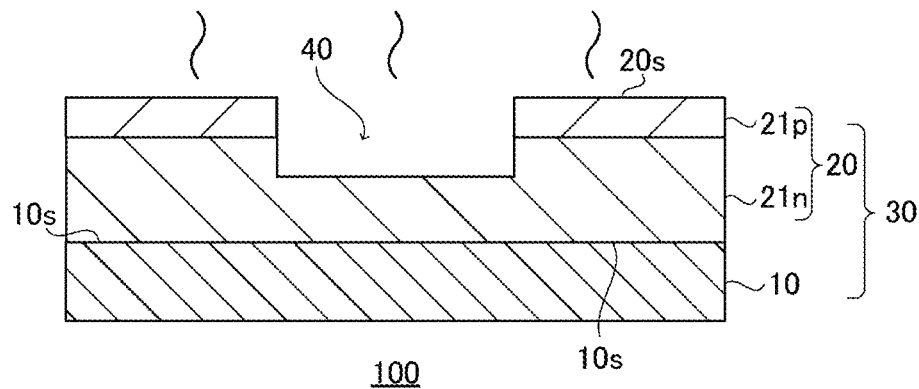

FIG. 14C illustrates activation annealing. Activation annealing is carried out to activate the n-type impurities in the epitaxial layer 21n, thereby making the epitaxial layer 21n into an n-type conductive layer, and to activate the p-type impurities in the epitaxial layer 21p, thereby making the epitaxial layer 21p into a p-type conductive layer. A technique known in the art may be used, as appropriate, to carry out the activation annealing.

Fourth Embodiment

Next, a fourth embodiment will be described. The fourth embodiment will be described along a second experimental example. The fourth embodiment features, as an example of a GaN material 100, an epitaxial substrate 30 that includes a GaN substrate 10 and an epitaxial layer 20 including an epitaxial layer 21n to which n-type impurities have been added and an epitaxial layer 21p to which p-type impurities have been added (see FIG. 14A). For the substrate 10, the substrate 10 described in the first embodiment may be used preferably.

The preferable etching conditions discussed in the first experimental example were applied in the second experimental example to carry out PEC etching to form a cylindrical protrusion in the GaN material 100. In other words, PEC etching was carried out to remove GaN on the outside of the cylindrical protrusion, the remnant serving as the cylindrical protrusion.

The epitaxial layer 21n was formed by growing a GaN layer having a Si concentration of $2\times10^{18}/cm^3$ and a thickness of 2 μm and a GaN layer having a Si concentration of $2\times10^{16}/cm^3$ and a thickness of 10 μm on the substrate 10 by MOVPE. The epitaxial layer 21p was formed by growing a GaN layer having a Mg concentration of $5\times10^{18}/cm^3$ and a thickness of 500 nm and a GaN layer having a Mg concentration of $2\times10^{20}/cm^3$ and a thickness of 20 nm on the epitaxial layer 21n by MOVPE. A circular mask having a diameter of 90 μm was formed on the epitaxial layer 21p using a Ti layer having a thickness of 50 nm. This mask was used in carrying out PEC etching on the GaN material 100 to a depth of 20 μm or more so as to form the cylindrical protrusion.

In this experimental example, PEC etching was carried out after carrying out activation annealing on the epitaxial layer 21p. This was done so to confirm the degree to which side etching occurs in a condition in which the epitaxial layer 21p is prone to being side etched. This activation annealing was carried out in the manner of heating that was carried out in a $N_2$ gas at 850° C. for 30 minutes.

Figure 15A:
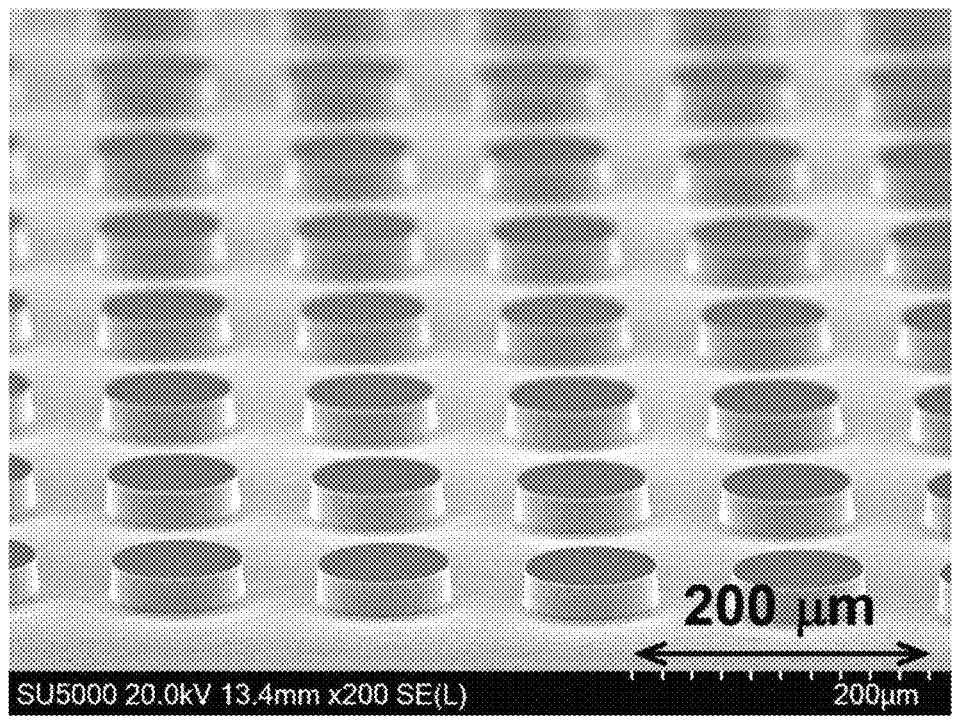
FIGS. 15A and 15B are SEM images in which cylindrical protrusions formed in a second experimental example (fourth embodiment) are viewed in an overhead view and a side view.
Figure 15B:
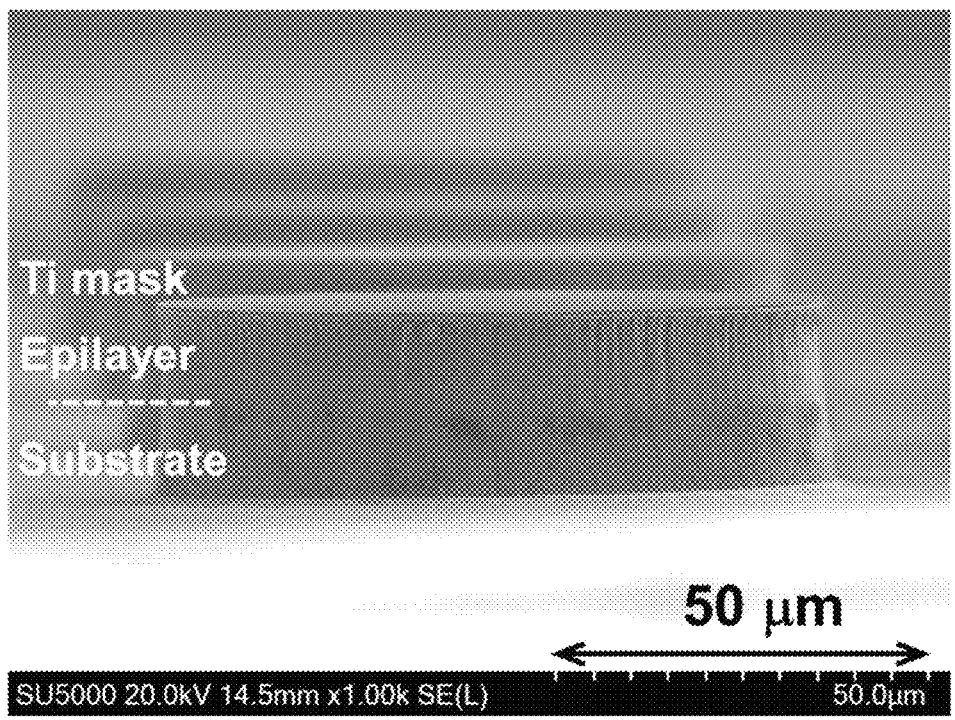
Figure 16:
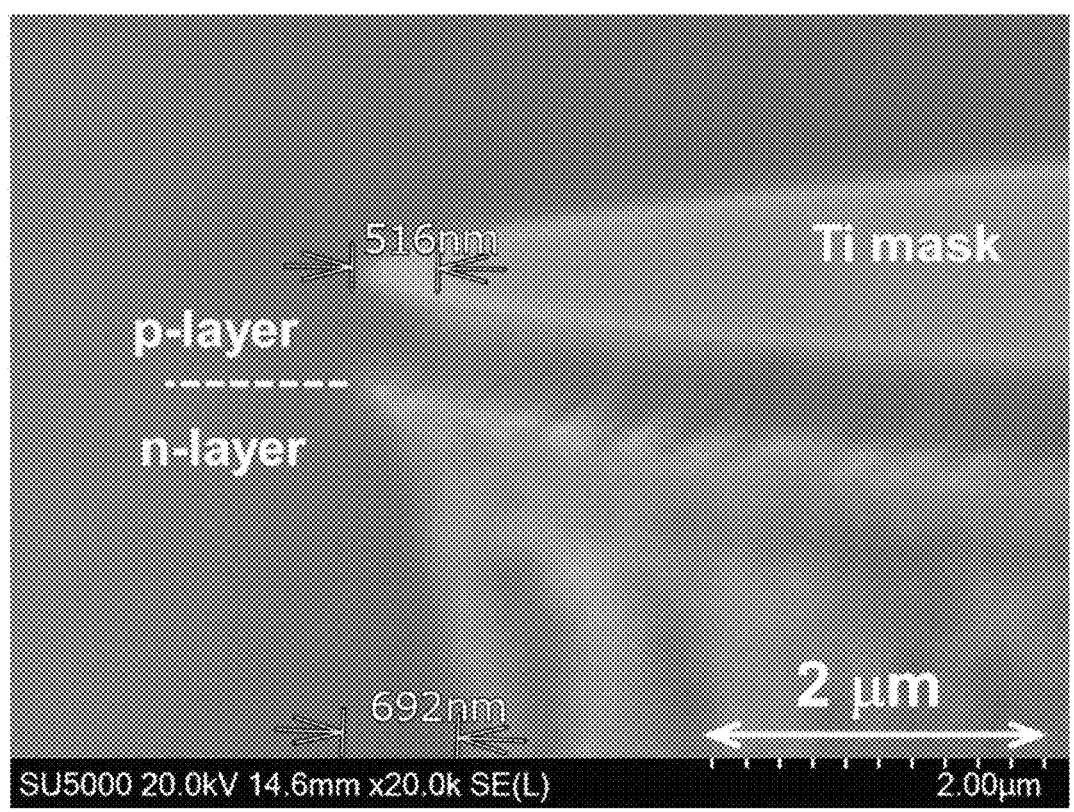
FIG. 16 is a SEM image in which a mask, a pn junction, and the vicinity thereof in the cylindrical protrusion formed in the second experimental example (fourth embodiment) are illustrated in enlarged fashion.

FIG. 15A is a SEM image illustrating an overhead view of the cylindrical protrusion. FIG. 15B is a SEM image illustrating a side view of the cylindrical protrusion. FIG. 16 is a SEM image in which the mask, the pn junction, and the vicinity thereof are illustrated in enlarged fashion. These SEM images show that the PEC etching according to this embodiment enables accurate production of a structure having a desired shape that accords with the mask.

Although etching was carried out to a depth of 20 μm or more, there is almost no reduction in the 50 nm-thickness Ti mask. In view of this, the etching selection ratio is estimated to be at least 400 (=20 μm/50 nm). Moreover, the side etching width in the epitaxial layer 21p directly under the Ti mask is estimated to be 516 nm, i.e. the width is limited to be no more than 1 μm. A metallic material as an example of a material that blocks UV light may be used preferably as a mask material for PEC etching, a more specific preferred example thereof to be used including Ti, Chromium (Cr), etc. The use of a mask material that limits PEC etching results in a reduction in the mask thickness, and the mask thickness may be 200 nm or less, for example.

The side face of each cylindrical protrusion is roughly perpendicular to the upper face of the cylindrical protrusion and assume the shape of a smooth curved face on the side face of the cylinder. The side faces of the cylindrical protrusions are homogeneous in the circumferential direction. The bottom face on the outside of the cylindrical protrusions, i.e. the bottom face formed using PEC etching, is very flat.

When observed more closely, in the side face, there are formed stripe-like fine protrusions and recesses that extend in the thickness (height) direction of the cylindrical protrusion, i.e. the direction in which PEC etching progresses.

Such stripe-like protrusions and recesses are also homogeneous in the circumferential direction, and no anisotropy is observed in particular.

Figure 23:
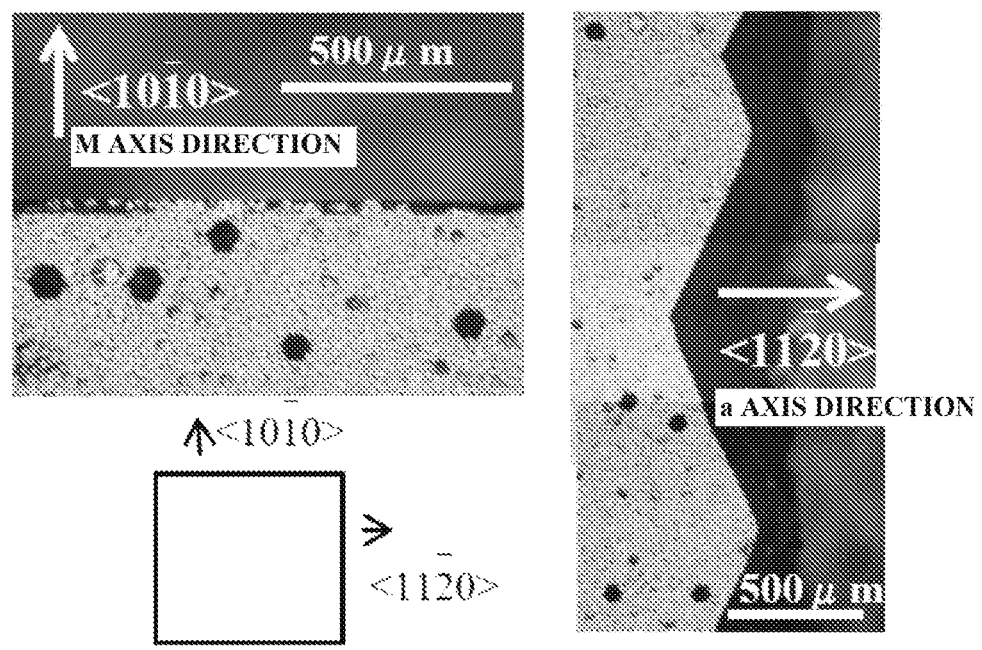
FIG. 23 is an optical microscopic photograph illustrating the result of an experiment in which a rectangular GaN material, the side faces of which are constituted by an a face and an m face perpendicular to the a face, is etched with hot phosphoric acid sulfuric acid.

The side face is a face that is roughly perpendicular to the c face of the GaN crystal. The inventors of the present invention have arrived at the finding that when a face that is perpendicular to the c face of a GaN crystal is etched with hot phosphoric acid sulfuric acid, which consist of the mixture phosphoric acid and sulfuric acid, the a face is etched more readily while the m face is etched less readily, and therefore the m face is prone to being exposed. FIG. 23 is an optical microscopic photograph illustrating the result of an experiment in which a rectangular GaN material, the side faces of which are constituted by the a face and the m face perpendicular to the a face, is etched with hot phosphoric acid sulfuric acid. The right part in FIG. 23 illustrates etching results for the a face and the upper left part of FIG. 23 illustrates etching results for the m face. As can be seen in the figure, assuming that the side face of the cylindrical protrusion is a face that is formed by etching with hot phosphoric acid sulfuric acid, the portion of the side face that is perpendicular to the a axis direction is formed from a face in which a plurality of m faces are connected to one another in zigzag fashion so that the face is perpendicular to the a axis direction on average, and the portion of the side face perpendicular to the m axis direction is formed flat from a single m face. In other words, when viewed in the circumferential direction, the constitution of a portion of such a side face that is perpendicular to the a axis direction and the constitution of a portion thereof that is perpendicular to the m axis direction demonstrate different anisotropies, and in the circumferential direction, overall, such a side face constitutes a coarse (angular) face in which the m faces connect to one another in zigzag fashion. The side face of the cylindrical protrusion according to this experimental example has limited anisotropy in the circumferential direction and is less coarse (smoother) compared to a side face that is formed by etching with hot phosphoric acid sulfuric acid. It should be noted that such characteristics are also achieved for the side face of a protrusion having other shapes than a cylindrical shape, such as a prismatic columnar shape.

As can be seen from FIG. 16, the side etching width is smaller at the pn junction, and a shape is formed such that the pn junction protrudes outward. This reflects the fact that the hole lifetime is shorter and PEC etching progresses with more difficulty at the pn junction. This experimental example illustrates an example case where PEC etching was is carried out after the epitaxial layer 21p has undergone activation annealing. By carrying out PEC etching before subjecting the epitaxial layer 21p to activation annealing, it is possible to reduce the side etching width in the epitaxial layer 21p, and protrusion of the pn junction can therefore be limited.

Fifth Embodiment

Next, a fifth embodiment will be described. The fifth embodiment will be described along a third experimental example. The fifth embodiment features an epitaxial substrate 30, which includes a GaN substrate 10 and an epitaxial layer 20 to which n-type impurities have been added, as an example of a GaN material 100 (see FIG. 3). For the substrate 10, the substrate 10 described in the first embodiment may be used preferably. The preferable etching conditions discussed in the first experimental example were applied in the third experimental example to carry out PEC etching to form a cylindrical recess in the GaN material 100.

The epitaxial layer 20 was formed by growing a GaN layer having a Si concentration of $2\times10^{18}/cm^3$ and a thickness of 2 μm and a GaN layer having a Si concentration of $1.5\times10^{16}/cm^3$ and a thickness of 5.8 μm on the substrate 10 by MOVPE. A mask having circular apertures with diameters of 1 μm, 5 μm, 10 μm, and 20 μm were formed on the epitaxial layer 20 using a Ti layer having a thickness of 50 nm. This mask was used in carrying out PEC etching on the GaN material 100 to a depth of 7.7 μm so as to form a cylindrical recess.

Figure 17:
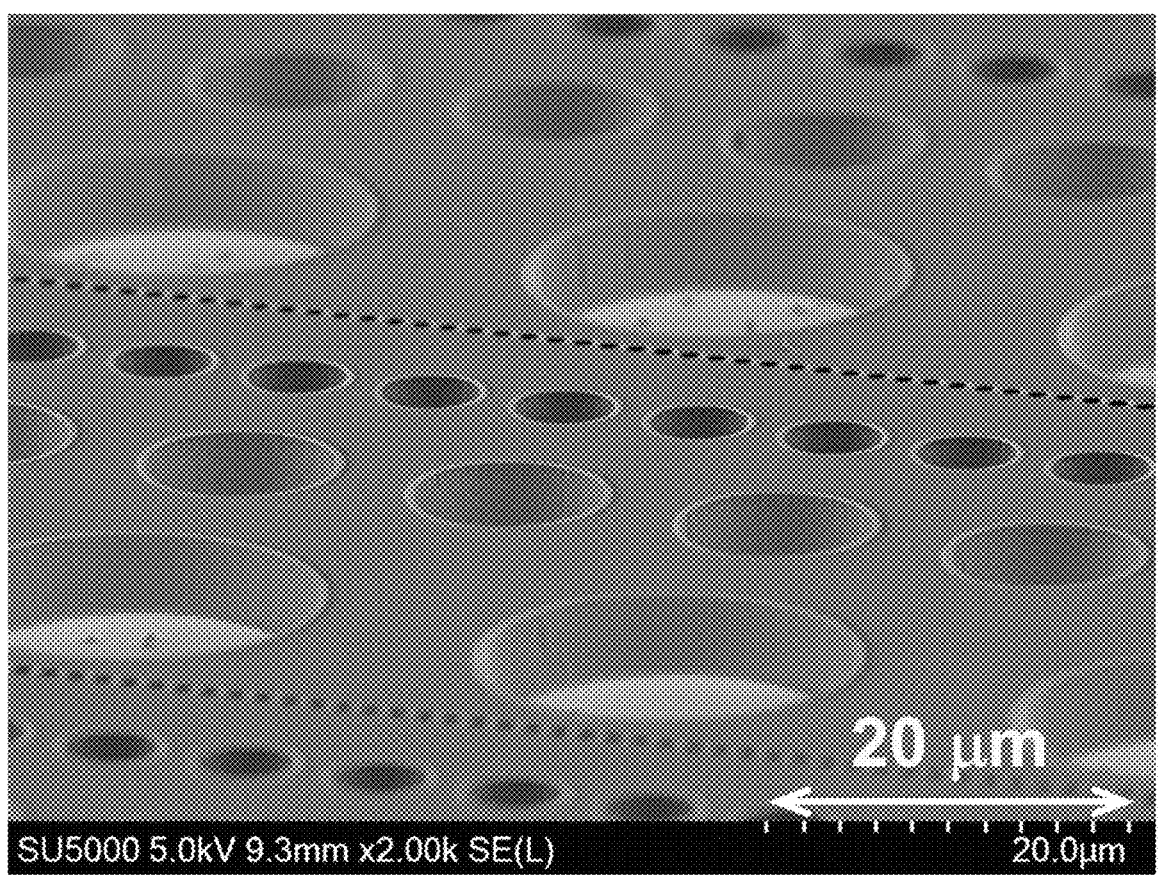
FIG. 17 is a SEM image in which cylindrical recesses formed in a third experimental example (fifth embodiment) are viewed in an overhead view.

FIG. 17 is a SEM image in which cylindrical recesses are viewed in an overhead view. In the side face and the bottom face of the recess formed using PEC etching, characteristics similar to those of the protrusion described in the second experimental example are observed. That is, the side face of each recess is roughly perpendicular to the upper face on the outside of the recess and assumes the shape of a smooth curved face on the side face of the cylinder. The side faces of the recesses are homogeneous in the circumferential direction. The bottom face of each recess is formed very flat. When observed more closely, in the side faces, stripe-like fine protrusions and recesses that extend in the thickness (depth) direction of the recesses are formed homogeneously in the circumferential direction. The side faces have limited anisotropy in the circumferential direction and are less coarse (smoother) compared to a side face that is formed by etching with hot phosphoric acid sulfuric acid.

In the SEM image in FIG. 17, small bumps distributed discretely can be observed in the bottom faces of the 20 μm-diameter recesses. The areas between the bumps are constituted by faces that are more flat than the bumps. The bottom faces of the recesses are faces that follow the c face more or less. The inventors of the present invention have confirmed that dark spots are observed in the center of the bumps in SEM cathodoluminescence images. In view of this, it is considered that the bumps correspond to dislocations and since the hole lifetime is shorter and PEC etching progresses with more difficulty at the dislocations, the bumps were formed. It should be noted that a bottom face on the outside of a protrusion in the case where a protrusion is formed as in the second experimental example is a bottom face that is formed using PEC etching, so may have similar characteristics.

As described above, the PEC etching according to this embodiment is a processing method that causes almost no damage to a GaN crystal (see FIG. 13), so damage to a side face and a bottom face formed using the PEC etching according to this embodiment is limited. Thus, in SEM cathodoluminescence images, compared to the dark spots resulting from dislocations and observed in the bottom face, areas on the outside of the dislocations in the bottom faces are observed as being lighter and the side faces are observed as being lighter compared to the dark spots.

The band-edge peak intensities of the PL emission spectra for the side face and bottom face formed using the PEC etching according to this embodiment have intensities that are 90% or more in relation to the band-edge peak intensity of the PL emission spectrum for a surface (an upper face on the outside of a recess when a recess is formed, or an upper face of a protrusion when a protrusion is formed) that is protected by a mask and not etched.

Sixth Embodiment

Next, a sixth embodiment will be described. The sixth embodiment will be described along a fourth experimental example. The sixth embodiment features an epitaxial substrate 30, which includes a GaN substrate 10 and an epitaxial layer 20 to which n-type impurities have been added, as an example of a GaN material 100 (see FIG. 3). For the substrate 10, the substrate 10 described in the first embodiment may be used preferably. The preferable etching conditions discussed in the first experimental example were applied in the fourth experimental example to carry out PEC etching to form a groove-like recess (trench) in the GaN material 100.

The constitution of the epitaxial layer 20 is equivalent to that described in the third experimental example (fifth embodiment). A mask having linear apertures with widths of 1.4 μm, 2.8 μm, and 5.6 μm were formed on the epitaxial layer 20 using a Ti layer having a thickness of 50 nm. Two experiments were conducted using the mask: an experiment in which the GaN material 100 was subject to PEC etching to a target depth of 7.7 μm to form a trench; and an experiment in which the GaN material 100 was subject to PEC etching to a target depth of 33 μm to form a trench.

Figure 18A:
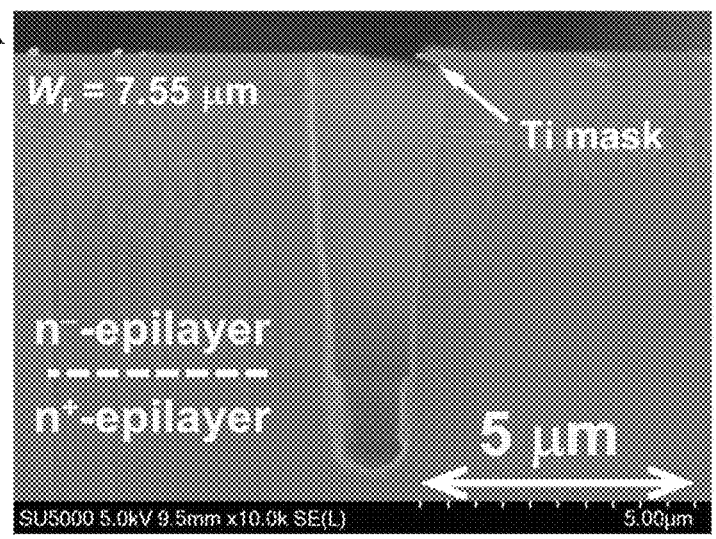
FIGS. 18A through 18C are SEM images illustrating cross-sections of trenches (target depth: 7.7 μm) formed in a fourth experimental example (sixth embodiment), where the cross-sections are taken along a direction perpendicular to the length direction of the trenches.
Figure 18B:
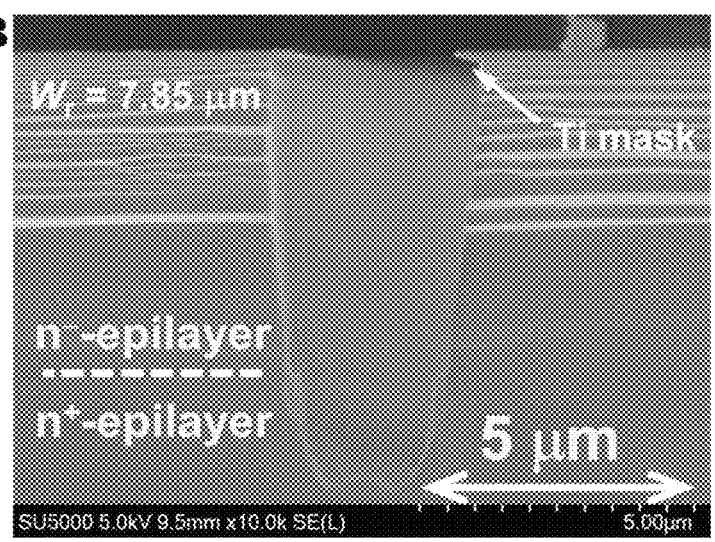
Figure 18C:
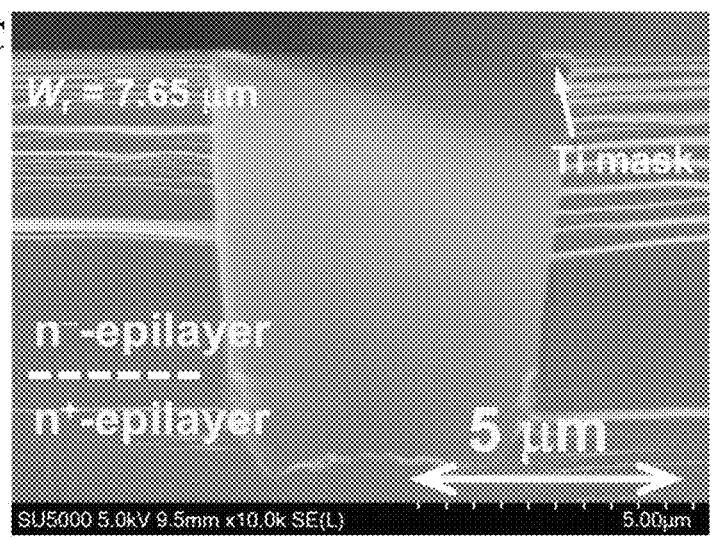

FIGS. 18A through 18C are SEM images illustrating cross-sections of trenches (target depth: 7.7 μm), where the cross-sections are taken along a direction perpendicular to the length direction of the trenches. The length direction of the trench, i.e. the length direction of the mask aperture, is parallel to the m axis, and the cross-section is a cleavage surface of them face. FIG. 18A is a SEM image of a trench having a mask aperture width of 1.4 μm, FIG. 18B is a SEM image of a trench having a mask aperture width of 2.8 μm, and FIG. 18C is a SEM image of a trench having a mask aperture width of 5.6 μm.

The actual measured values of the depths of the trenches having the mask aperture widths of 1.4 μm, 2.8 μm, and 5.6 μm are 7.55 μm, 7.85 μm, and 7.65 μm, respectively, and are all roughly equal to the target depth 7.7 μm. These results show that in this experimental example, a constant etching rate can be maintained during etching if the target depth of a trench is about 8 μm, for example, and that etched depth can be controlled on the basis of etching duration with ease.

Figure 19A:
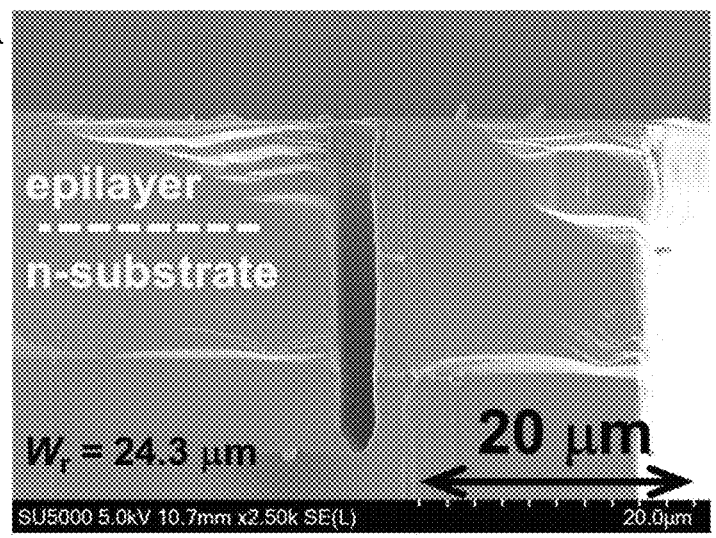
FIGS. 19A through 19C are SEM images illustrating cross-sections of trenches (target depth: 33 μm) formed in the fourth experimental example (sixth embodiment), where the cross-sections are taken along a direction perpendicular to the length direction of the trenches.
Figure 19B:
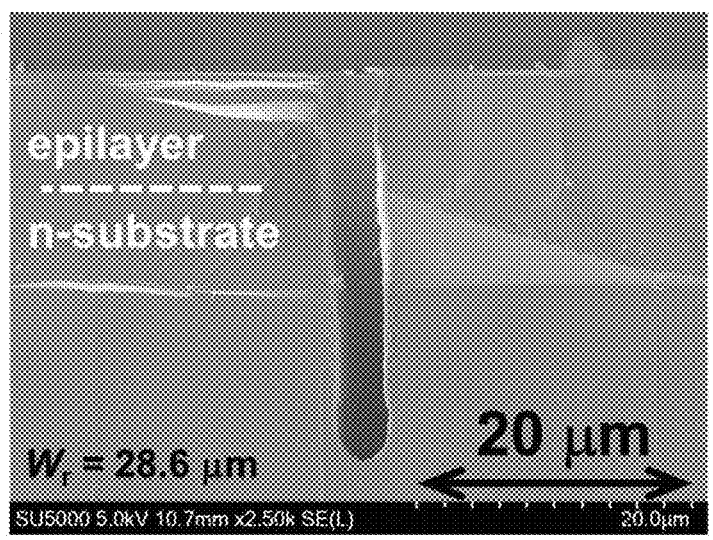
Figure 19C:
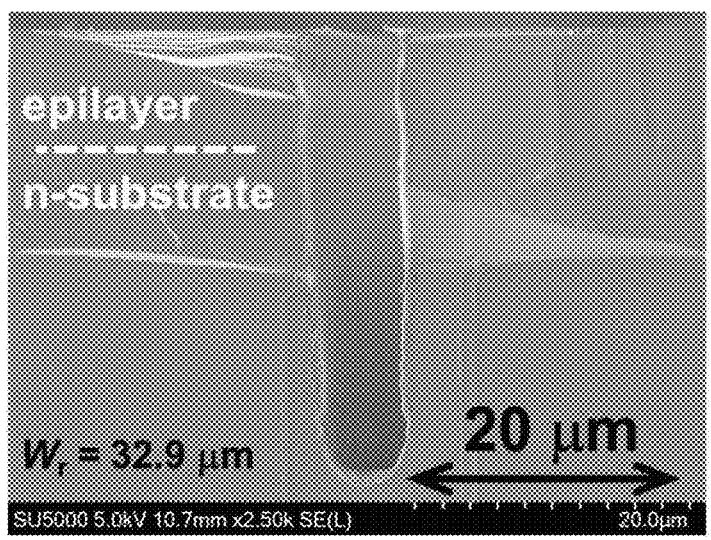

FIGS. 19A through 19C are SEM images illustrating cross-sections of trenches (target depth: 33 μm), where the cross-sections are taken along a direction perpendicular to the length direction of the trenches. Similarly to FIGS. 18A to 18C, the cross-sections are each a cleavage surface of the m face. FIG. 19A is a SEM image of a trench having a mask aperture width of 1.4 μm, FIG. 19B is a SEM image of a trench having a mask aperture width of 2.8 μm, and FIG. 19C is a SEM image of a trench having a mask aperture width of 5.6 μm.

The depth of the trench having the mask aperture width of 5.6 μm is 32.9 μm and is roughly equal to the target depth 33 μm. Meanwhile, the depths of the trenches having the mask aperture widths of 2.8 μm and 1.4 μm are 28.6 μm and 24.3 μm, respectively, and are shallower than the target depth 33 μm. The tendency of the trench depth being shallower than the target depth is more prominent as the mask aperture width is narrower. The reason therefor is considered to be that when the target depth of the trench is as deep as, for example, 30 μm, the influence of the arrival of UV light at the vicinity of the trench bottom being impeded due to the reduction in the mask aperture width becomes greater, leading to a reduction in the etching rate. In this regard, an improvement in UV light collimation is considered to limit such a reduction in the etching rate.

As can be seen in the SEM image in FIG. 18A and the like, the edge of the trench aperture recedes laterally directly under the mask, or in other words, the mask protrudes in eave-like fashion on the edge of the trench aperture, i.e. side etching is has occurred.

Figure 20:
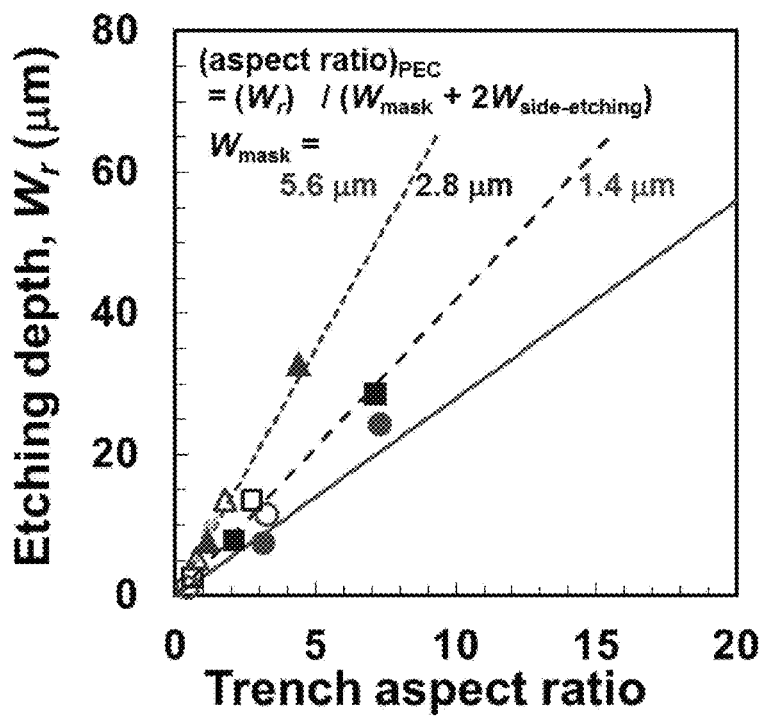
FIG. 20 is a graph illustrating a relationship between etched depth and an aspect ratio of a trench formed in the fourth experimental example (sixth embodiment)

FIG. 20 is a graph illustrating a relationship between etched depth and an aspect ratio of a trench formed in the fourth experimental example. An aspect ratio of a recess (e.g. trench) is defined as the ratio of an etched depth (depth of the recess) $W_r$ to a width W of the upper end of the recess (=$W_r$/W). The width W of the upper end of the recess is expressed as the sum of the mask aperture width $W_{mask}$ and a value obtained by doubling the side etching width $W_{side\text{-}etching}$ on one side directly under the mask (=$W_{mask}$+ $2W_{side\text{-}etching}$).

FIG. 20 also illustrates results for other recesses that were formed using PEC etching while setting the mask aperture width to an equivalent value. The results for the trenches in the fourth experimental example (FIGS. 18A through 19C) are indicated with blacked-out plots and the results for the other recesses are indicated with outlined plots. The circular plots indicate the actual measured values representing the relationships between the aspect ratios and the etched depths for the mask aperture width of 1.4 µm. The square plots indicate the actual measured values representing the relationships between the aspect ratios and the etched depths for the mask aperture width of 2.8 µm. The triangular plots indicate the actual measured values representing the relationships between the aspect ratios and the etched depths for the mask aperture width of 5.6 µm. The relationships between the aspect ratios and the etched depths $W_r$ for the case where the mask aperture width $W_{mask}$ was set to 1.4 µm, 2.8 µm, and 5.6 µm and the side etching width $W_{side\text{-}etching}$ on one side was assumed to be 0.7 µm are indicated by the solid line, broken line, and dotted line, respectively.

For the trench with the target depth of 7.7 µm in the fourth experimental example: the depth and the aspect ratio for the mask aperture width of 1.4 µm are 7.55 µm and 3.1, respectively; the depth and the aspect ratio for the mask aperture width of 2.8 µm are 7.85 µm and 2.1, respectively; and the depth and the aspect ratio for the mask aperture width of 5.6 µm are 7.65 µm and 1.2, respectively. For the trench with the target depth of 33 µm in the fourth experimental example: the depth and the aspect ratio for the mask aperture width of 1.4 µm are 24.3 µm and 7.3, respectively; the depth and the aspect ratio for the mask aperture width of 2.8 µm are 28.6 µm and 7.1, respectively; and the depth and the aspect ratio for the mask aperture width of 5.6 µm are 32.9 µm and 4.4, respectively.

The plots of the actual measured values are more or less distributed on the lines for the case where the side etching width is assumed to be 0.7 µm. This shows that the side etching width is maintained to be constant and about 0.7 µm even when the etched depth is deepened (to be, for example, 5 µm or more or, for example, 10 µm or more), i.e. the side etching width is limited to be no more than 1 µm. It is also shown that the side etching width is maintained to be constant and about 0.7 µm even when the mask aperture width changes.

A comparison between FIGS. 18A through 18C with FIGS. 19A through 19C reveals the tendency of the inclination of the trench side face resulting from side etching increasing in conformity with a decrease in etched depth. In other words, it can be said that from the viewpoint of increasing the parallelness of side faces that face other, it is preferable to deepen the etched depth. The following gives rough estimated values for when the side etching width directly under the mask is set to be 0.7 µm as described above and the trench bottom width and the mask aperture width are assumed to be equivalent. It is preferred that: the etched depth be set to 8 µm or more so as to make the inclination of the side face relative to the side etching width no more than 5°; the etched depth be set to 10 µm or more so as to make the inclination of the side face relative to the side etching width no more than 4°; the etched depth be set to 13.5 µm or more so as to make the inclination of the side face relative to the side etching width no more than 3°; and the etched depth be set to 20 µm or more so as to make the inclination of the side face relative to the side etching width no more than 2°. The side faces may be treated with tetramethylammonium hydroxide (TMAH) and the like after PEC etching so as to make the side faces perpendicular.

In the state of the art, attempts are made to form trenches by subjecting GaN to dry etching. For trenches obtained in the state of the art, however, the aspect ratio is at most about 3 and the depth is at most about 3 µm. With dry etching, it is difficult to increase the etching selection ratio of GaN relative to the mask material, so it is not possible to form deep trenches having a depth of, for example, 5 µm or more. Since deep trenches cannot be formed in the state of the art, trenches with a high aspect ratio of, for example, 5 or more have not been obtained. Moreover, dry etching has the problem of causing significant damage to the surface of GaN subject to etching.

The inventors of the present invention have succeeded in forming a trench having a depth of 5 µm or more in the GaN material 100 by using the PEC etching according to this embodiment in the fourth experimental example. Furthermore, the inventors of the present invention have succeeded in forming a trench with a high aspect ratio of 5 or more. Specifically, a trench having a depth of 24.3 µm and an aspect ratio of 7.3 (mask aperture width=1.4 µm; see FIG. 19A) and a trench having a depth of 28.6 µm and an aspect ratio of 7.1 (mask aperture width=2.8 µm; see FIG. 19B) could be formed.

PEC etching gives rise to side etching. If the side etching width widens in conformity with the etched depth, an increase in the aspect ratio becomes difficult. In the fourth experimental example, the inventors of the present invention arrived at the undiscovered finding that using the PEC etching according to this embodiment, the side etching width can be maintained to be more or less constant even if the etched depth deepens (to, for example, 5 µm or more or, for example, 10 µm or more). Then, based on this finding that the side etching width can be maintained to be more or less constant, the inventors of the present invention arrived at the undiscovered finding that the aspect ratio can be increased proportionally to the etched depth and that it is possible to form a trench with a high aspect ratio of, for example, 5 or more (see FIG. 20). According to this finding, it is also possible to form a trench with an aspect ratio of, for example, 10 or more.

Notwithstanding the above, the inventors of the present invention also arrived at the undiscovered finding mentioned above, namely that deepening the etched depth becomes more difficult as the mask aperture width narrows (see FIGS. 19A and 19B). To give a specific example, the difficulty of deepening the etched depth increases from the mask aperture width of 5.6 µm (see FIG. 19C) to the mask aperture width of 2.8 µm (see FIG. 19B). The actual trench width that is obtained by adding up the side etching widths (1.4 µm) on both sides is 7 µm for the mask aperture width of 5.6 µm and 4.2 µm for the mask aperture width of 2.8 µm. Thus, it can be said that when the trench width is, for example, 6 µm or less or, for example, 5 µm or less, then it is difficult to form a deep trench and increase the aspect ratio. According to this experimental example, it was found that a trench with an aspect ratio of, for example, 5 or more can be formed even when the trench width is, for example, 6 µm or less or, for example, 5 µm or less.

Note that while a groove-like recess (trench) has been given as an example to describe the formation of a recess with a high aspect ratio, the shape of the flat surface of the upper end (shape of the aperture) of the recess may be changed, as appropriate, and the PEC etching according to this embodiment may be used to form a recess other than a groove-like recess (trench), for example, a cylindrical recess or a prismatic columnar recess with a high aspect ratio of, for example, 5 or more or, for example, 10 or more. The width of the upper end of the recess used to define the aspect ratio may be, for example, the width of the shortest portion.

Although there are no particular limitations on the upper limit of the aspect ratio, the upper limit of the etched depth is the thickness of the GaN material 100. A recess formed using the PEC etching according to this embodiment may encompass a structure in which the GaN material 100 is penetrated through (i.e. the recess does not have a bottom face), in which case the etched depth of the recess penetrating through the GaN material 100 will coincide with the thickness of the GaN material 100. The purpose of penetrating through the GaN material 100 may be, for example, to form a through-hole, or to divide (separate) the GaN material 100 into a plurality of segments. The aspect ratio of the through-hole is defined similarly to that of a recess having a bottom face, with the thickness of the GaN material serving as the etched depth.

In the state of the art, neither are formed protrusions (for example, ridges) with a height of 5 µm or more, nor are formed protrusions (for example, ridges) with a high aspect ratio of 5 or more. The PEC etching according to this embodiment can also be used to form a protrusion having a height of 5 µm or more and to form a protrusion with an aspect ratio of, for example, 5 or more or, for example, 10 or more (see FIG. 22B). An aspect ratio of a protrusion (e.g. ridge) is defined as the ratio of an etched depth (height of the protrusion) $W_r$ to a width $W$ of the upper end of the protrusion (=$W_r/W$). The width $W$ of the upper end of the protrusion is expressed as the difference between the mask width $W_{mask}$ and a value obtained by doubling the side etching width $W_{side-etching}$ on one side directly under the mask (=$W_{mask}-2W_{side-etching}$). The shape of the flat surface of the upper end of the protrusion may be selected, as appropriate. The width of the upper end of the protrusion used to define the aspect ratio may be, for example, the width of the shortest portion.

In conformity with the above discussion about trench formation, also when forming a protrusion, the side etching width directly under the mask relative to the PEC etching according to this embodiment is maintained to be constant and about 0.7 µm, i.e. limited to be no more than 1 µm, more or less independently of the etched depth or the mask width. Conditions for limiting the inclination of a side face relative to the side etching width are equivalent to those that have been discussed in relation to trench formation.

It should be noted that the PEC etching according to this embodiment may also be used preferably when forming a recess or a protrusion with an aspect ratio of, for example, less than 5. As described above, the PEC etching according to this embodiment is a processing method that causes almost no damage to a GaN crystal, so this PEC etching is favorable for the formation of any recesses or protrusions regardless of the aspect ratio.

Other Embodiments

Embodiments of the present invention have been described above by way of specific examples. However, the present invention is not limited to the above embodiments, and can undergo, for example, changes, improvements, or combinations in various ways within the scope of the invention.

The aforementioned PEC etching can be used preferably as part of a method for producing a semiconductor device in which a GaN material is used. For example, this PEC etching can be used for a structure formation method when producing a Schottky barrier diode using the GaN material 100 according to the second embodiment (an epitaxial substrate 30 in which an epitaxial layer 20 is constituted by a GaN layer to which n-type impurities have been added).

To cite another example, this PEC etching can be used for a structure formation method when producing a superjunction (SJ) structure by forming a trench in an n-type area of an epitaxial layer 20 and regrowing (loading) a p-type epitaxial layer in the trench (see FIG. 22A); here, the conductive type may be reversed and an n-type epitaxial layer may be regrown (loaded) in a trench formed in a p-type epitaxial layer 20.

Furthermore, the aforementioned PEC etching can be used as a structure formation method when producing a pn junction diode or a transistor using the GaN material 100 according to the third embodiment (an epitaxial substrate 30 in which an epitaxial layer 20 includes a GaN layer to which n-type impurities have been added and a GaN layer to which p-type impurities have been added). For example, this PEC etching can be used for the formation of a mesa structure or the formation of a ridge structure of a laser diode.

It is also possible to carry out processing in which this PEC etching is used to remove only a p-type GaN layer constituting the surface layer of an n-p layered structure, as exemplified by the case of producing a junction barrier Schottky (JBS) diode.

The constitution of the epitaxial layer 20 can be selected, as appropriate, according to need and, for example, may include a GaN layer to which no electroconductive impurities are added or may be constituted by a layered structure of, for example, n-p-n. This PEC etching may be carried out exclusively on a specific layer of an epitaxial layer 20 having a layered structure. The GaN substrate is not limited to the substrate 10 described in the first embodiment and a GaN substrate having an area having an adequately low dislocation density (for example, lower than $1\times10^7/cm^2$) is used preferably. The electroconductivity of the substrate 10 may be selected, as appropriate.

To give an example, a metal-insulator-semiconductor field effect transistor (MISFET) of a trench gate structure may be produced in the following way. A layered structure of n-p-n (or p-n-p) is adopted for the epitaxial layer 20; a recess 40 is formed in the epitaxial layer 20 using PEC etching; and a npn junction (or pnp junction) serving as the operation part for the transistor is formed on the side face 23 of the recess 40. An insulated gate electrode is formed in the recess 40 (see FIG. 22A), in addition to which a source electrode and a drain electrode to be electrically connected to the n layers of the npn layered structure (or the p layers of the pnp layered structure) are formed. With this production method, the PEC etching can be used to form a MIS interface, at which the npn junction (or pnp junction) serving as the operation part for a semiconductor device is located, while incurring little damage and the resultant interface having superior flatness; thus, a semiconductor device having high operation performance can be produced simply.

The electrode structure when producing a semiconductor device using the GaN material 100 may differ according to the electroconductive characteristics of the substrate 10. For example, the structure of an electrode to be electrically connected to an n-type GaN layer formed on the front surface of the substrate 10 may be as follows. For example, when producing a light-emitting diode (LED) using an n-type conductive substrate 10, the electrode may be formed on the rear surface of the substrate 10. Meanwhile, when, for example, producing a GaN-high electron mobility transistor (HEMT) using a semi-insulating substrate 10, the electrode will be formed on the n-type GaN layer, i.e. on the front surface side of the substrate 10.

Application of the aforementioned PEC etching is not limited to semiconductor devices such as diodes or transistors, and more generally, this PEC etching may be used preferably as a method for producing structures in which GaN material is used. In addition to the aforementioned manners of usage, the PEC etching may also be used, for example, when dicing wafer that is formed from a GaN material or for the formation of a component of micro-electro-mechanical systems (MEMS) in which GaN is used. This PEC etching may also be used to etch the entirety of the principal face of a GaN material.

As in the case where a recess having a bottom face or a protrusion is formed, both the bottom face and the side face formed using PEC etching may sometimes be exposed on the surface of the GaN material having been etched. Alternatively, as in the case where a GaN material is penetrated through (e.g. when a through-hole is formed or the GaN material is divided into segments), only the side face formed using PEC etching may be exposed on the surface of the GaN material having been etched. Further, as in the case where an entire face is etched, only the bottom face formed using PEC etching may be exposed on the surface of the GaN material having been etched.

Figure 21:
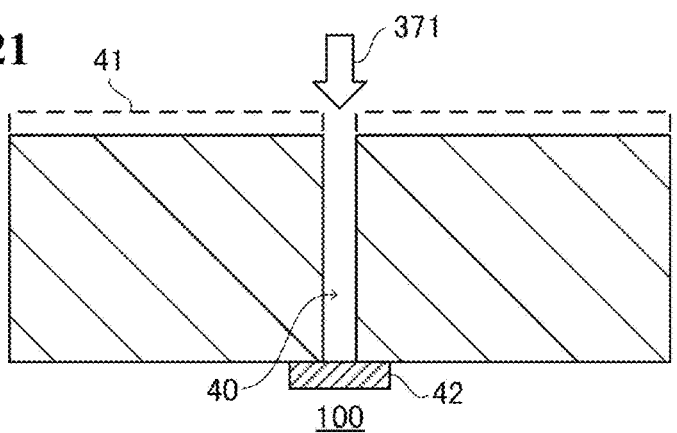
FIG. 21 is a schematic diagram illustrating an example of a situation where PEC etching is carried out to penetrate through a GaN material.

When etching is carried out to penetrate through the GaN material, such as when a through-hole is formed or the GaN material is divided, the GaN material having been etched has an area in which the side face formed using the PEC etching is exposed throughout the entire thickness. This side face has a property and shape that are similar to what has been described in the fourth and fifth embodiments as a trace of PEC etching. When the entire face is etched, the GaN material having been etched has an area in which the bottom face formed using PEC etching is exposed entirely. This bottom face has a property and shape that are similar to what has been described in the fourth and fifth embodiments as a trace of PEC etching FIG. 21 is a schematic diagram illustrating an example of a situation where PEC etching is carried out to penetrate through a GaN material 100, such as when a through-hole is formed or the GaN material is divided. In a case like this, a seal member 42 may be provided on the bottom face and the side face of the GaN material 100 according to need, so that the electrolyte solution does not leak in the course of penetration.

The aforementioned embodiments illustrate examples of a case where PEC etching is carried out in the depth direction from the c face which has a large area and with which it is easy to form a plurality of structures, but illustrating such examples does not deprive the present invention of applications in which PEC etching is carried out in the depth direction from other crystal faces.

Figure 22A:
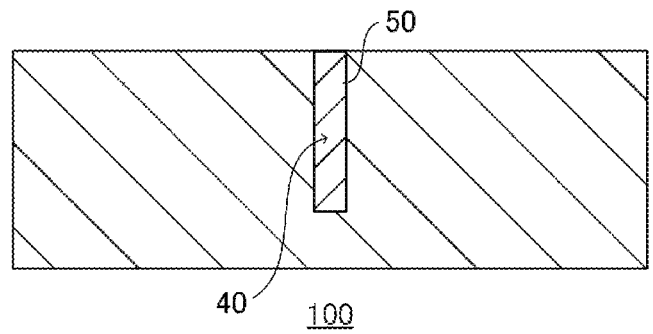
FIG. 22A is a schematic diagram illustrating an example of a situation where a filling member is loaded into a recess formed using PEC etching.
Figure 22B:
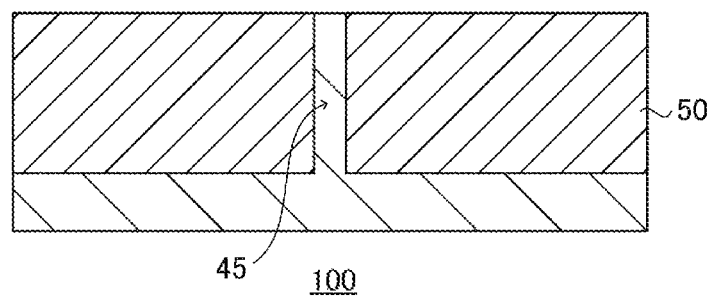
FIG. 22B is a schematic diagram illustrating an example of a situation where a filling member is loaded on the outside of a protrusion formed using PEC etching.

The structure produced using the PEC etching described above may be constituted by a combination of the GaN member having a structure formed using the PEC etching and another member. Note that the state in which a mask used in PEC etching is formed (remains) on a GaN member that has a structure formed using the PEC etching (see, for example, FIG. 18A) may be regarded as an intermediate structure used to obtain a final structure. When a certain member is loaded inside a recess formed using the aforementioned PEC etching and thus the recess is not exposed to the outer face of the structure, the structure includes the recess regardless. Likewise, even when a certain member is loaded on the outside of a protrusion formed using the aforementioned PEC etching and thus the protrusion is not exposed to the outer face of the structure, the structure includes the protrusion regardless. FIG. 22A is a schematic diagram illustrating an example of a situation where a filling member 50 is loaded into a recess 40 formed using PEC etching. FIG. 22B is a schematic diagram illustrating an example of a situation where a filling member 50 is loaded on the outside of a protrusion 45 formed using PEC etching.

<Preferable Aspects of the Present Invention>

Preferable aspects of the present invention will be supplementarily described hereafter.

(Supplementary Description 1)

A structure comprising a member constituted by a single crystal of gallium nitride,
    the member including a recess (formed using photo-electrochemical etching), the recess having an aspect ratio of 5 or more (preferably 10 or more).

(Supplementary Description 2)

The structure according to Supplementary description 1, wherein the recess has a depth of 5 μm or more.

(Supplementary Description 3)

The structure according to Supplementary description 1 or 2, wherein the recess has a depth of preferably 8 μm or more, more preferably 10 μm or more, yet more preferably 13.5 μm or more, yet more preferably 20 μm or more.

(Supplementary Description 4)

The structure according to any one of Supplementary descriptions 1 through 3, wherein a width of an upper end of the recess is preferably 6 μm or less, more preferably 5 μm or less.

(Supplementary Description 5)

The structure according to any one of Supplementary descriptions 1 through 4, wherein the structure further comprises another member loaded inside the recess.

(Supplementary Description 6)

The structure according to any one of Supplementary descriptions 1 through 5, wherein the recess is formed in an area of the member, the area being of a first conductive type, and
    the structure further comprises another member loaded inside the recess, this other member being of a second conductive type differing from the first conductive type.

(Supplementary Description 7)

The structure according to any one of Supplementary descriptions 1 through 6, wherein the recess is a through-hole.

(Supplementary Description 8)

A structure comprising a member constituted by a single crystal of gallium nitride, the member including a protrusion (formed using photo-electrochemical etching), the protrusion having an aspect ratio of 5 or more (preferably 10 or more).

(Supplementary Description 9)

The structure according to Supplementary description 8, wherein the protrusion has a height of 5 μm or more.

(Supplementary Description 10)

The structure according to Supplementary description 8 or 9, wherein the protrusion has a height of preferably 8 μm or more, more preferably 10 μm or more, yet more preferably 13.5 μm or more, yet more preferably 20 μm or more.

(Supplementary Description 11)

The structure according to claim any one of Supplementary descriptions 8 through 10, wherein the structure further comprises another member loaded on the outside of the protrusion.

(Supplementary Description 12)

A structure comprising a member constituted by a single crystal of gallium nitride, the member including a recess or a protrusion (formed using photo-electrochemical etching), a side face of the recess or a side face of the protrusion being a face smoother than (with the anisotropy of the side face in the circumferential direction also being limited compared to) a side face formed by etching the member with hot phosphoric acid sulfuric acid.

(Supplementary Description 13)

The structure according to Supplementary description 12, wherein stripe-like recesses and protrusions extending in the thickness direction are formed (homogeneously in the circumferential direction) in the side face of the recess or the side face of the protrusion.

(Supplementary Description 14)

The structure according to Supplementary description 12 or 13, wherein the bottom face of the recess or the bottom face on the outside of the protrusion has bumps resulting from dislocations and distributed discretely, and areas between the bumps are more flat compared to the bumps.

(Supplementary Description 15)

A structure (the structure according to any one of Supplementary descriptions 12 through 14) comprising a member constituted by a single crystal of gallium nitride, the member including a recess or a protrusion (formed using photo-electrochemical etching), wherein in a scanning electron microscopy cathodoluminescence image of the recess, compared to a dark spot resulting from a dislocation and observed in a bottom face of the recess, an area on the outside of the dislocation in the bottom face is observed as being lighter, and a side face of the recess is observed as being lighter than the dark spot, or in a scanning electron microscopy cathodoluminescence image of the protrusion, compared to a dark spot resulting from a dislocation and observed in the bottom face on the outside of the protrusion, an area on the outside of the dislocation in the bottom face is observed as being lighter, and a side face of the protrusion is observed as being lighter than the dark spot (Supplementary Description 16)

A structure (the structure according to any one of Supplementary descriptions 12 through 15) comprising a member constituted by a single crystal of gallium nitride, the member including a recess or a protrusion (formed using photo-electrochemical etching), wherein each of band-edge peak intensities of PL emission spectra for a side face of the recess and a bottom face of the recess has an intensity that is 90% or more in relation to a band-edge peak intensity of a PL emission spectrum for an upper face on the outside of the recess, or each of band-edge peak intensities of PL emission spectra for a side face of the protrusion and a bottom face on the outside of the protrusion has an intensity that is 90% or more in relation to a band-edge peak intensity of a PL emission spectrum for an upper face of the protrusion.

(Supplementary Description 17)

A structure (the structure according to any one of Supplementary descriptions 12 to 16) comprising a member constituted by a single crystal of gallium nitride, the member including a recess or a protrusion (formed using photo-electrochemical etching), wherein, on a side surface of the recess or the protrusion, a pn junction is exposed in protruding fashion.

(Supplementary Description 18)

The structure according to any one of Supplementary descriptions 12 through 17, wherein a depth of the recess is 5 μm or more or a height of the protrusion is 5 μm or more.

(Supplementary Description 19)

The structure according to any one of Supplementary descriptions 1 to 18, wherein the recess or the protrusion is formed as a result of etching the member from the c face in the depth direction.

(Supplementary Description 20)

A structure comprising a member constituted by a single crystal of gallium nitride and having been divided (separated) from another member using photo-electrochemical etching, wherein on a side face of the member, stripe-like protrusions and recesses are formed as a trace of the division from the other member using the photo-electrochemical etching, the stripe-like protrusions and recesses being formed over the entire thickness of the member and extending in a thickness direction of the member.

(Supplementary Description 21)

A structure comprising a member constituted by a single crystal of gallium nitride, the member including a through-hole formed using photo-electrochemical etching, wherein on a side face of the through-hole, stripe-like protrusions and recesses are formed as a trace of the formation of the through-hole using the photo-electrochemical etching, the stripe-like protrusions and recesses being formed over the entire thickness of the member and extending in a thickness direction of the member.

(Supplementary Description 22)

The structure according to Supplementary descriptions 20 or 21, wherein a band-edge peak intensity of a PL emission spectrum for the side face has an intensity that is 90% or more in relation to a band-edge peak intensity of a PL emission spectrum for an upper face of the member.

(Supplementary Description 23)

The structure according to any one of Supplementary descriptions 1 through 22, wherein the gallium nitride material constituting the member has no area in which a dislocation density is $1 \times 10^7/\text{cm}^2$ or more.

(Supplementary Description 24)

The structure according to any one of Supplementary descriptions 1 through 23, wherein the gallium nitride material constituting the member is a gallium nitride material (having a low dislocation density and high in-plane uniformity to a degree of) having a calculated average profile roughness Ra of a bottom face of a recess for a measurement length of 100 μm of preferably 15 nm or less, more preferably 10 nm or less, yet more preferably 5 nm or less, the recess having a depth of 2 (or lower than or equal to 2 μm) and being formed as a result of the gallium nitride material being subjected to PEC etching with an etching voltage of 1 V while being irradiated with UV light (Supplementary Description 25)

An intermediate structure comprising
 a member constituted by a single crystal of gallium nitride, and
 a mask formed upon the member, wherein
 the member is etched (using photo-electrochemical etching) to a depth of 5 μm or more (preferably 10 μm or more) using the mask,
 side etching occurs in the form of recession of the member directly under the mask, and
 a side etching width directly under the mask is 1 μm or less.

(Supplementary Description 26)

The intermediate structure according to Supplementary description 25, wherein the mask is formed from a material blocking UV light, preferably from a metallic material, and has a thickness of 200 nm or less.

DESCRIPTION OF REFERENCE SYMBOLS

1: underlying substrate
2: underlying layer
2a: void-including layer
3: metal layer
3a: nanomask
4: void-formed layer
5: void
6: crystal
10: GaN substrate
20: GaN layer (epitaxial layer)
21n: GaN layer to which n-type impurities have been added
21p: GaN layer to which p-type impurities have been added
22: area subject to etching
23: side face
23pn: pn junction
30: epitaxial substrate
40: recess
41: mask
42: seal member
45: protrusion
50: filling member
100: GaN material
6s, 10s, 20s: principal face
200: HVPE device
300: electrochemical cell
310: container
320: electrolyte solution
330: cathode electrode
340: anode electrode
350: wire
360: voltage source
370: light source
371: UV light
380: pump

The invention claimed is:

1. A structure comprising:
 a first member constituted by a single crystal of gallium nitride,
  the first member including a recess,
  the recess having an aspect ratio of 5 or more and a depth of 5 μm or more, and
  a bottom of the recess being constituted by the gallium nitride, and
  an upper face of the first member outside of an aperture of the recess being c face;
 and
 a second member loaded inside the recess.

2. The structure according to claim 1, wherein a width of an upper end of the recess is 6 μm or less.

3. The structure according to claim 1, wherein
 the first member comprises a first conductive type,
 the second member comprises a second conductive type differing from the first conductive type, and
 the second member forms a pn junction with the first member.

4. The structure according to claim 1, wherein the second member is an insulated gate electrode.

5. The structure according to claim 1, wherein a bottom face of the recess is a flat face that is parallel to an upper face of the first member outside of an aperture of the recess.

6. The structure according to claim 1, wherein an edge of the aperture of the recess has a portion that is not perpendicular to m axis.

7. The structure according to claim 3, wherein the second member forms the pn junction with the first member on the bottom of the recess.

* * * * *